US011854961B2

(12) United States Patent
Chen et al.

(10) Patent No.: US 11,854,961 B2
(45) Date of Patent: Dec. 26, 2023

(54) PACKAGE SUBSTRATE AND METHOD OF FABRICATING THE SAME AND CHIP PACKAGE STRUCTURE

(71) Applicants: Industrial Technology Research Institute, Hsinchu (TW); Unimicron Technology Corp., Taoyuan (TW)

(72) Inventors: Yu-Hua Chen, Hsinchu (TW); Wei-Chung Lo, New Taipei (TW); Tao-Chih Chang, Taoyuan (TW); Yu-Min Lin, Hsinchu County (TW); Sheng-Tsai Wu, Taoyuan (TW)

(73) Assignees: Industrial Technology Research Institute, Hsinchu (TW); Unimicron Technology Corp., Taoyuan (TW)

( * ) Notice: Subject to any disclaimer, the term of this patent is extended or adjusted under 35 U.S.C. 154(b) by 235 days.

(21) Appl. No.: 17/095,744

(22) Filed: Nov. 12, 2020

(65) Prior Publication Data

US 2021/0082810 A1     Mar. 18, 2021

Related U.S. Application Data

(60) Continuation-in-part of application No. 16/036,946, filed on Jul. 17, 2018, now Pat. No. 10,867,907.
(Continued)

(51) Int. Cl.
*H01L 29/00*     (2006.01)
*H01L 23/522*    (2006.01)
(Continued)

(52) U.S. Cl.
CPC ...... *H01L 23/5226* (2013.01); *H01L 21/4857* (2013.01); *H01L 23/49822* (2013.01);
(Continued)

(58) Field of Classification Search
CPC ............ H01L 23/5226; H01L 21/4857; H01L 23/49822; H01L 23/49833; H01L 23/49838; H01L 25/04
See application file for complete search history.

(56) References Cited

U.S. PATENT DOCUMENTS

| 8,003,515 | B2 * | 8/2011 | Meyer | H01L 23/5389 |
| | | | | 438/106 |
| 8,269,337 | B2 * | 9/2012 | Hu | H01L 23/49833 |
| | | | | 257/702 |
| 9,748,157 | B1 * | 8/2017 | Chi | H01L 23/49811 |

* cited by examiner

*Primary Examiner* — Dale E Page
*Assistant Examiner* — Colleen E Snow
(74) *Attorney, Agent, or Firm* — JCIPRNET

(57) ABSTRACT

A package substrate includes a substrate, an insulating protective layer and an interposer. The substrate has a first surface and a second surface opposing to the first surface. The substrate includes a plurality of first conductive pads embedded in the first surface. The insulating protective layer is disposed on the first surface of the substrate. The insulating protective layer has an opening for exposing the first conductive pads embedded in the first surface of the substrate. The interposer has a top surface and a bottom surface opposing to the top surface. The interposer includes a plurality of conductive vias and a plurality of second conductive pads located on the bottom surface. The interposer is located in a recess defined by the opening of the insulating protective layer and the first surface of the substrate. Each of the second conductive pads is electrically connected to corresponding first conductive pad.

27 Claims, 25 Drawing Sheets

Related U.S. Application Data which is a division of application No. 15/468,087, filed on Mar. 23, 2017, now Pat. No. 10,068,847, which is a division of application No. 13/965,842, filed on Aug. 13, 2013, now abandoned.

(51) Int. Cl.
*H01L 23/498* (2006.01)
*H01L 25/04* (2023.01)
*H01L 21/48* (2006.01)

(52) U.S. Cl.
CPC .. *H01L 23/49833* (2013.01); *H01L 23/49838* (2013.01); *H01L 25/04* (2013.01); *H01L 2924/0002* (2013.01)

PACKAGE SUBSTRATE AND METHOD OF FABRICATING THE SAME AND CHIP PACKAGE STRUCTURE

CROSS-REFERENCE TO RELATED APPLICATION

This application is a continuation-in-part application of and claims the priority of U.S. patent application Ser. No. 16/036,946, filed on Jul. 17, 2018, now allowed, which is a divisional application of and claims the priority benefit of U.S. application Ser. No. 15/468,087, filed on Mar. 23, 2017, now patented. The prior U.S. application Ser. No. 15/468,087 is a divisional application of and claims the priority benefit of U.S. application Ser. No. 13/965,842, filed on Aug. 13, 2013, now abandoned, which claims the priority benefit of Taiwan application serial no. 101135246, filed on Sep. 26, 2012. The entirety of each of the above-mentioned patent applications is hereby incorporated by reference herein and made a part of specification.

BACKGROUND

Technical Field

The present disclosure relates to package substrates and methods of fabricating the same, and relates to a package substrate having an embedded interposer and a method of fabricating the same.

Description of Related Art

With the rapid development of the electronics industry, electronic products are becoming more and more compact, and the directions for research and development of their functions are moving towards high performance, multi-function, and high speed, resulting in increasing wiring density of semiconductor chips in the scale of nanometer. Therefore, package substrates for carrying the chips (such as flip-chip carriers) can no longer meet the demands for high wiring density of the semiconductor chips, thus a so-called 3D-SiP (System-in-package) packaging process is developed in the industry.

SUMMARY

The disclosure provides a package substrate including a substrate, an insulating protective layer and an interposer. The substrate has a first surface and a second surface opposing to the first surface. The substrate includes a plurality of first conductive pads embedded in the first surface. The insulating protective layer is disposed on the first surface of the substrate. The insulating protective layer has an opening for exposing the first conductive pads embedded in the first surface of the substrate. The interposer has a top surface and a bottom surface opposing to the top surface. The interposer includes a plurality of conductive vias and a plurality of second conductive pads located on the bottom surface. The interposer is located in a recess defined by the opening of the insulating protective layer and the first surface of the substrate. Each of the second conductive pads is electrically connected to corresponding first conductive pad.

The disclosure further provides a method of fabricating a package substrate includes the following steps. A substrate having a first surface and a second surface opposing the first surface is provided, wherein the substrate comprises a plurality of first conductive pads embedded in the first surface. An interposer having a top surface and a bottom surface opposing to the top surface is provided, wherein the interposer comprises a plurality of conductive vias and a plurality of second conductive pads located on the bottom surface. A wiring redistribution layer is formed on the top surface of the interposer. An insulating protective layer is provided to encapsulate the wiring redistribution layer and the interposer. The second conductive pads of the interposer connect with the plurality of first conductive pads of the substrate.

The disclosure further provides a chip package structure including a chip, a package structure, a first conductive block and a second conductive block. The chip has an active surface. The package substrate includes an interposer and an insulating protective layer. The interposer has a top surface, a bottom surface opposing to the top surface and side surfaces. The interposer includes a plurality of conductive vias and a plurality of conductive pads located on the bottom surface. The insulating protective layer encapsulates the side surfaces of the interposer. The first conductive block is located between the active surface of the chip and the top surface of the interposer and electrically connected with the chip and at least one of the plurality of conductive vias of the interposer. The second conductive block is located between the active surface of the chip and the insulating protective layer, wherein a width of the first conductive block is smaller than a width of the second conductive block.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6C' is an enlarged view of a portion of FIG. 6C.

FIG. 6F' shows another embodiment different from the embodiment shown in FIG. 6F.

DESCRIPTION OF THE EMBODIMENTS

Figure 1:
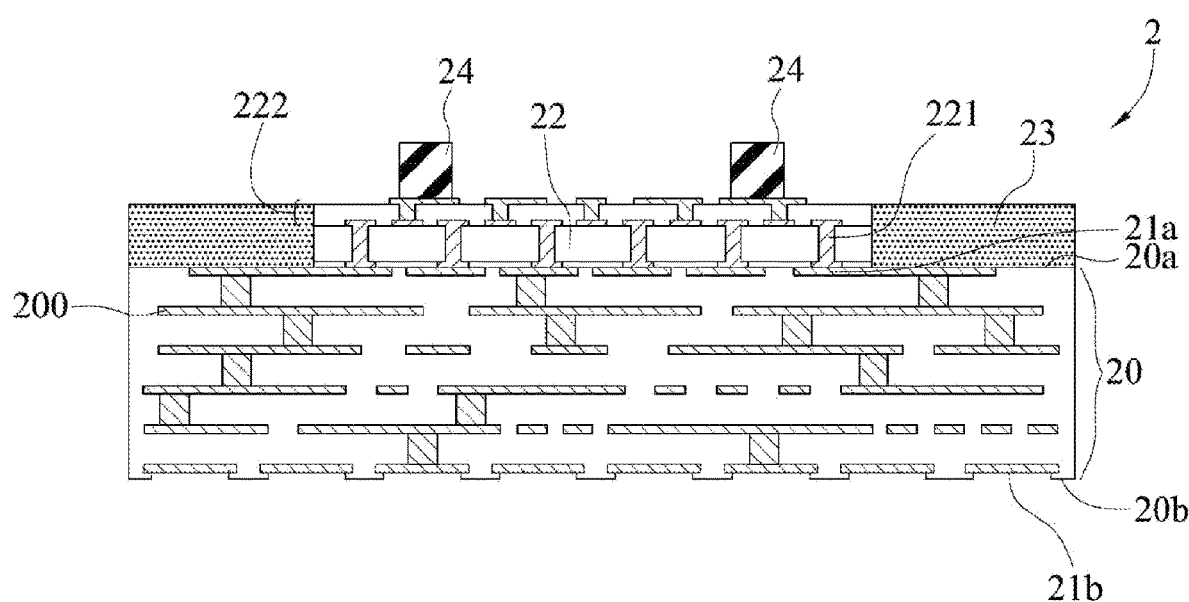
FIG. 1 is a cross-sectional view of a package substrate according to a first embodiment of the present disclosure.

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

It should be noted that the structures, proportions, sizes and the like shown in the attached drawings are to be considered only in conjunction with the contents of this specification to facilitate understanding and reading of those skilled in the art, and are not intended to limit the scope of present disclosure, thus they do not hold any real technically significance, and any changes or modifications in the structures, the proportions, the sizes and the like should fall within the scope of the technical contents disclosed in the present disclosure as long as they do not affect the effects and the objectives achieved by the present disclosure. Meanwhile, terms such as "on", "top", "bottom", "surrounding", "above", "one" or "a" used in this specification are used for ease of illustration only, and not to limit the scope of the present disclosure, any changes or modifications of the relative relationships of elements are therefore to be construed as with the scope of the present disclosure as long as there is no changes to the technical contents. The terms (such as "first", "second", "third" . . . ) used in this specification are provided to mark and/or describe the features of each corresponding embodiment, and those terms (such as "first", "second", "third" . . . ) do not necessarily have any meanings regarding order, hierarchy or sequence (for example, special sequence, time sequence, step sequence, etc.).

"Conductive vias" as mentioned herein refers to conductive components formed on a substrate, for example, the interposer herein. As shown in the diagrams, the shape of the conductive vias can be columnar.

First Embodiment

Referring to FIG. 1, a cross-sectional view of a package substrate 2 according to a first embodiment of the present disclosure is shown.

A substrate 20 having wirings 200, a top surface (can be regarded as a first surface) 20a and a bottom surface (can be regarded as a second surface) 20b is provided. In an embodiment, the substrate 20 is a multilayer interconnect base plate. The top surface 20a has a plurality of conductive pads 21a. An interposer 22 and an insulating protective layer 23 are formed on the top surface 20a. The interposer 22 is embedded into the insulating protective layer 23 and exposed from the surface of the insulating protection layer 23. A plurality of passive components 24 are provided on the interposer 22.

In an embodiment, the interposer 22 is a silicon interposer and has a plurality of penetrating conductive vias 221 and a wiring redistribution layer (RDL) 222 exposed from the insulating protective layer 23. The bottom ends of the conductive vias 221 are each connected to conductive pads 21a to electrically connect with the wirings 200, and the passive components 24 are arranged on the wiring redistribution layer 222 to be electrically connected with the interposer 22.

In another embodiment, the interposer 22 can be made of glass, ceramic, single crystal silicon or polysilicon, but the invention is not limited thereto. In an embodiment, when the interposer 22 is made of single crystal silicon, polysilicon or electric conducting materials, each of the conductive vias 221 has an insulating layer formed on the side wall thereof. In an embodiment, the interposer 22 may be an active interposer which may include integrated circuits formed therein, the integrated circuits may include transistors, memory cells, logic circuits, etc.

By disposing the passive components 24 on the wiring redistribution layer 222, when an active component (not shown) such as a semiconductor chip is provided on the wiring redistribution layer 222, the active component can be assembled in a way that it is closest to the passive components 24, thereby reducing the distance between the active component and the passive components 24.

Signals are transmitted to the substrate 20 through the wiring redistribution layer 222 and the passive components 24 connected in series, and the conductive vias 221, so that the electrical connection path between the active component and the passive components 24 is made shortest. As a result, the pins of the active component have stable voltage.

Second Embodiment

Figure 2A:
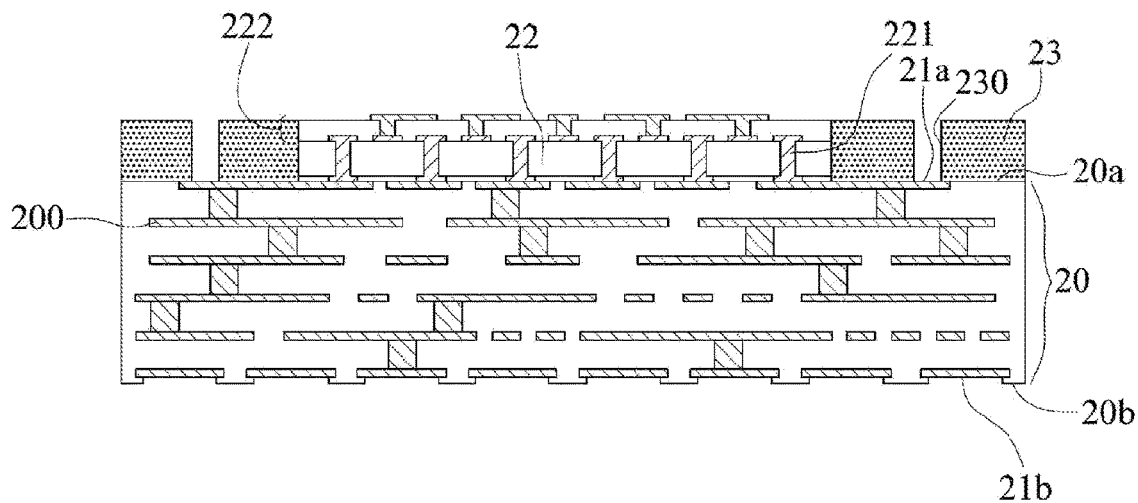
FIGS. 2A to 2C are cross-sectional views of a package substrate according to a second embodiment of the present disclosure.
Figure 2B:
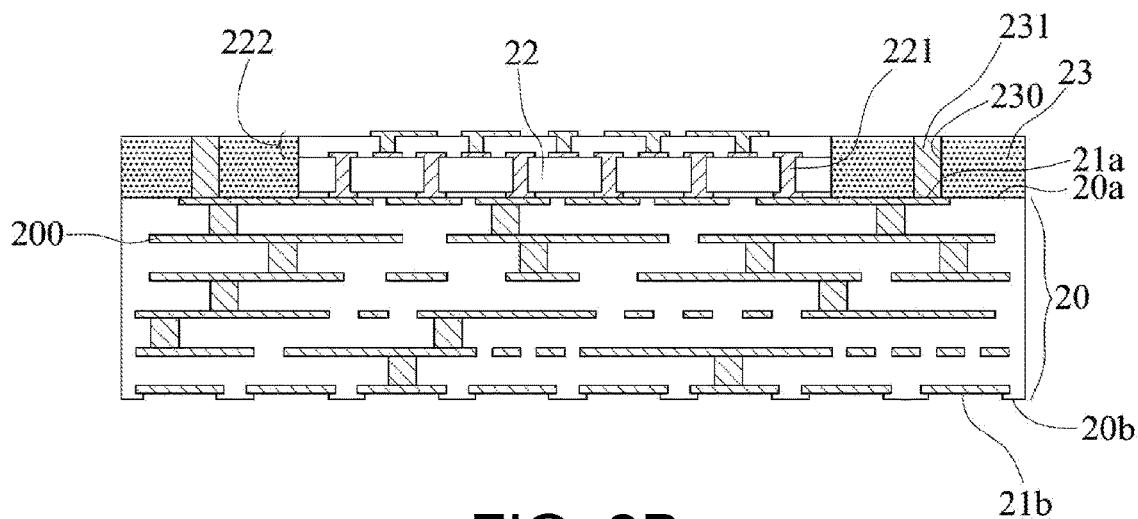
Figure 2C:
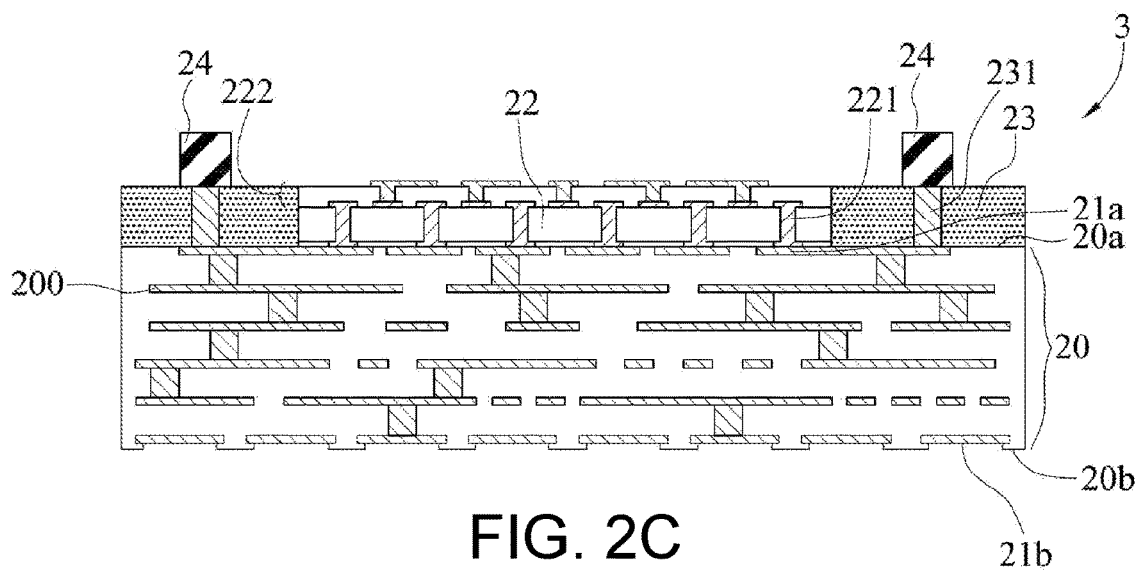

Referring to FIGS. 2A to 2C, cross-sectional views of a package substrate 3 according to a second embodiment of the present disclosure are shown. The second embodiment differs from the first embodiment in the locations and the electrical connection method of the passive components 24.

As shown in FIG. 2A, a plurality of holes 230 are formed in the insulating protective layer 23 at locations corresponding to a portion of the exposed conductive pads 21a by using a fixed-depth mechanical drilling method or a laser drilling method.

As shown in FIG. 2B, conductive components 231 such as columns are formed in the holes 230 by electroplating, printing, plugging or spin-coating techniques.

In an embodiment, the conductive components 231 are made of conductive adhesives or electroplated metals, such as copper paste or silver glue.

As shown in FIG. 2C, the passive components 24 are provided on the conductive components 231. The passive components 24 are electrically connected to the conductive pads 21a through the conductive components 231.

In an embodiment, by providing the passive components 24 on the insulating protective layer 23, an active component (not shown) with a larger size can be provided on the wiring redistribution layer 222. The present disclosure reduces the electrical connection path between the active component and the passive components 24, and allows the voltage of the pins of the active component to be more stable.

Third Embodiment

Figure 3:
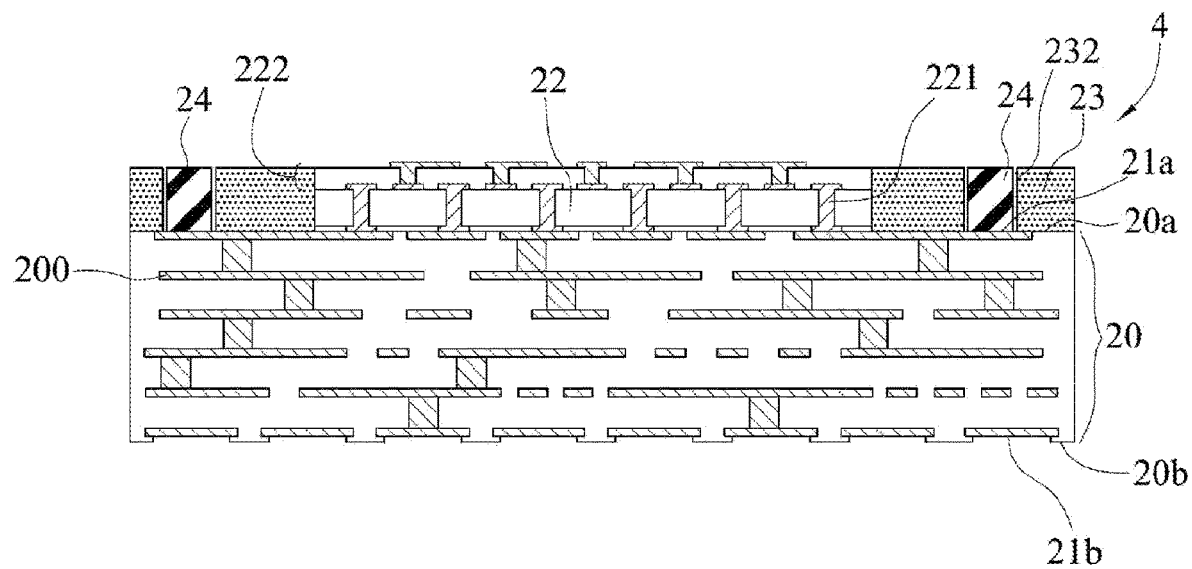
FIG. 3 is a cross-sectional view of a package substrate according to a third embodiment of the present disclosure.

Referring to FIG. 3, a cross-sectional view of a package substrate 4 according to a third embodiment of the present disclosure is shown. The third embodiment differs from the second embodiment in the locations and the electrical connection method of the passive components 24.

As shown in FIG. 3, a plurality of holes 232 are formed in the insulating protective layer 23 at locations corresponding to a portion of the exposed conductive pads 21a by using a fixed-depth mechanical drilling method or a laser drilling method. Then, the passive components 24 are soldered onto the conductive pads 21a in the holes 232 by dispensing, such that the passive components 24 are in contact with and electrically connected to the conductive pads 21a.

In an embodiment, by embedding the passive component 24 in the insulating protective layer 23, the height of the package substrate 4 can be reduced to facilitate product thinning.

Furthermore, when an active component is provided on the wiring redistribution layer 222, the present disclosure reduces the electrical connection path between the active component and the passive components 24, and allows the voltage of the pins of the active component to be more stable.

It should be noted that in the package substrate 2, 3, or 4 of the present disclosure, the wiring redistribution layer 222 of the interposer 22 is used for at least a active component such as a semiconductor chip (not shown) to be disposed, and packaging process is performed to form a semiconductor package.

Figure 4:
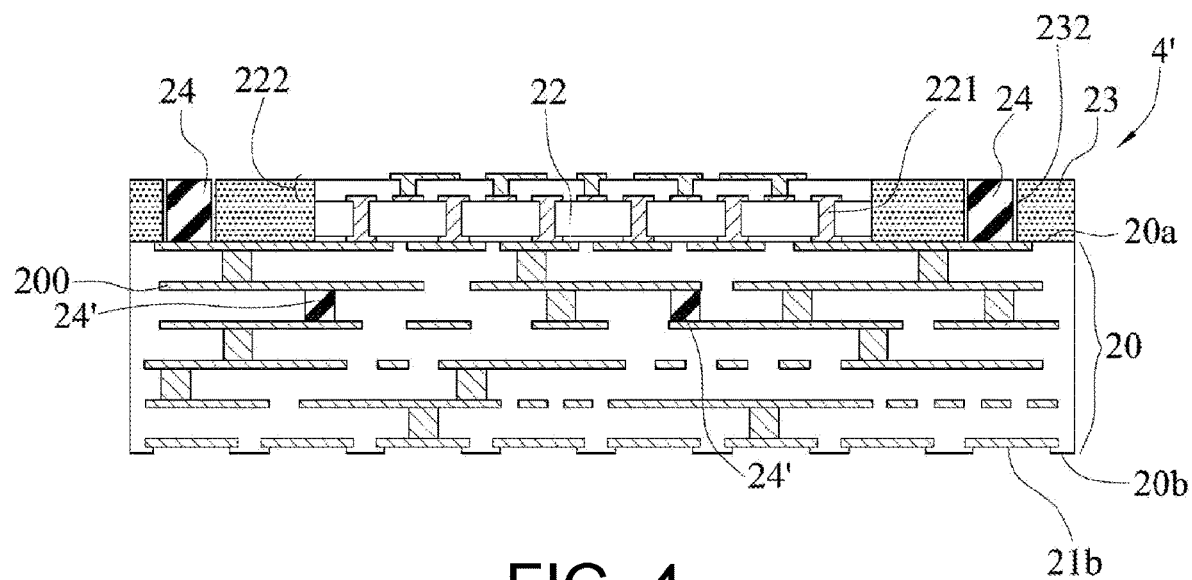
FIG. 4 is a cross-sectional view of a package substrate according to a fourth embodiment of the present disclosure.

In the production of the substrate 20, at least a passive component 24' can be buried in the substrate 20 and electrically connected to the wirings 200, as shown by the package substrate 4' in FIG. 4.

In addition, the bottom surface 20b of the substrate 20 of the present disclosure may also have conductive pads 21b for electrical connection to other electrical devices, such as circuit boards or package structures.

A coreless substrate 20 is used for illustrating the various embodiments described above, a substrate with a core layer can also be applied in the package substrates of the present disclosure, and is deemed to be within the range of the claims of the present disclosure.

In summary, in the package substrate 2, 3, or 4 of the present disclosure, the interposer 22 is integrated with the passive components 24, so when an active component is provided on the interposer 22, the distance between the active component and the passive components 24 is reduced, i.e., the electrical connection path between the active component and the passive components 24 is shortened. Therefore, the voltage of the pins of the active component can be more stable, and the electrical performance of the final electronic product is enhanced.

Fourth Embodiment

Referring to FIGS. 5A to 5F, a method for forming the package substrate 5 is illustrated.

Figure 5A:
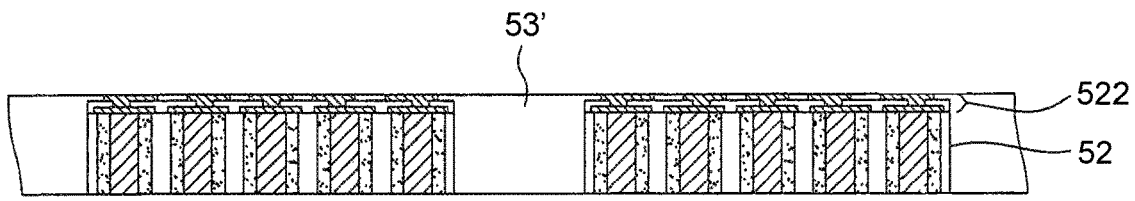
FIGS. 5A to 5F are cross-sectional diagrams illustrating a method for forming the package substrate in accordance with the present disclosure, wherein FIG. 5C' is an enlarged view of a portion of FIG. 5C, and FIG. 5F' shows another embodiment of FIG. 5F.

As Shown in FIG. 5A, a molding layer 53' is formed to encapsulate the interposer 52, so that the interposer 52 can be embedded into the molding layer 53', and the RDL 522 is exposed from the molding layer 53'.

Figure 5B:
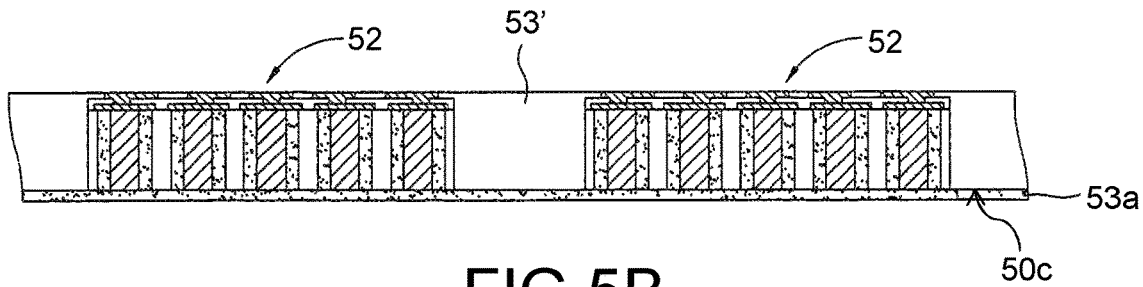

As shown in FIG. 5B, a second insulating layer 53a is formed on the second side 50c of the interposer 52 and the molding layer 53'.

Figure 5C:
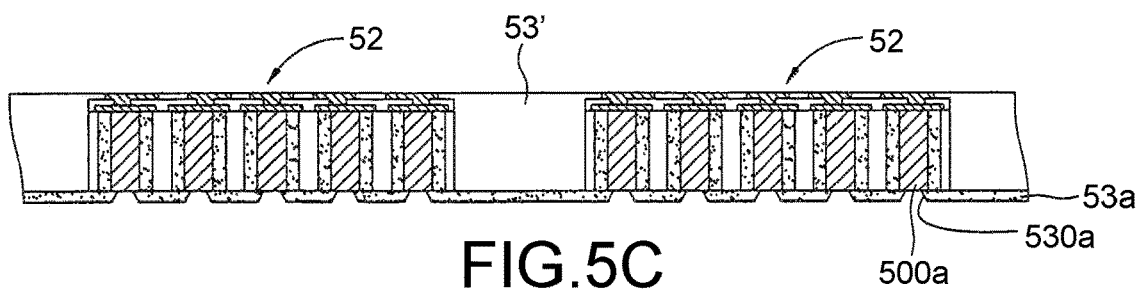
Figure 5C:
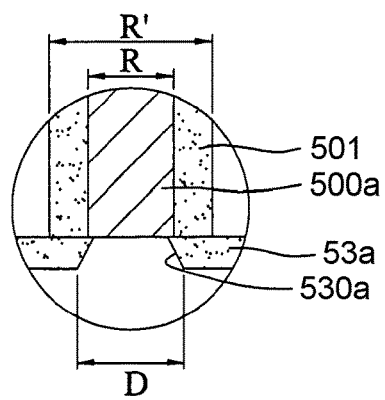

As shown in FIGS. 5C and 5C', a plurality of vias 530a are formed in the second insulating layer 53a by laser, such that the conductive through vias 500a are exposed from the vias 530a.

Figure 5D:
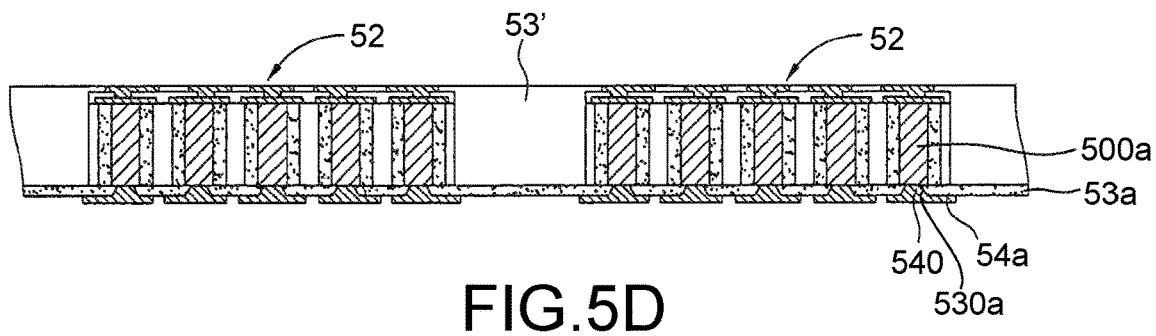

As shown in FIG. 5D, the circuit layer 54a is formed on the second insulating layer 53a, and the conductive vias 540 are formed in the vias 530a to electrically connect the conductive through vias 500a with the circuit layer 54a.

In the present embodiment, by increasing the thickness of the insulating layer outside the conductive through vias 500a, the face diameter R of the conductive through vias 500a can be not more than 80 μm (e.g. 50 μm). As shown in FIG. 5C', the face diameter R' formed by the conductive through vias 500a and the first insulating layer 501 can be more than 80 μm. Therefore, when laser opening is performed, it is easier to align the openings. Therefore, the vias 530a (with a diameter D of 40 μm) can be easily made to be completely within the face of the conductive through vias 500a. This enhances the yield of electrical connections between the conductive vias 540 and the conductive through vias 500a.

The laser opening technique may use, for example, a UV laser with a drilling diameter of 30 μm and an alignment accuracy of ±10 μm. In this case, the face diameter R of the conductive through vias 500a may be 50 μm.

Even if the location of a vias 530a is offset, the conductive via 540 will come into contact with the first insulating layer 501 instead of the silicon material of the interposer 52, thereby avoiding poor electrical connection between the conductive vias 540 and the conductive through vias 500a.

Figure 5E:
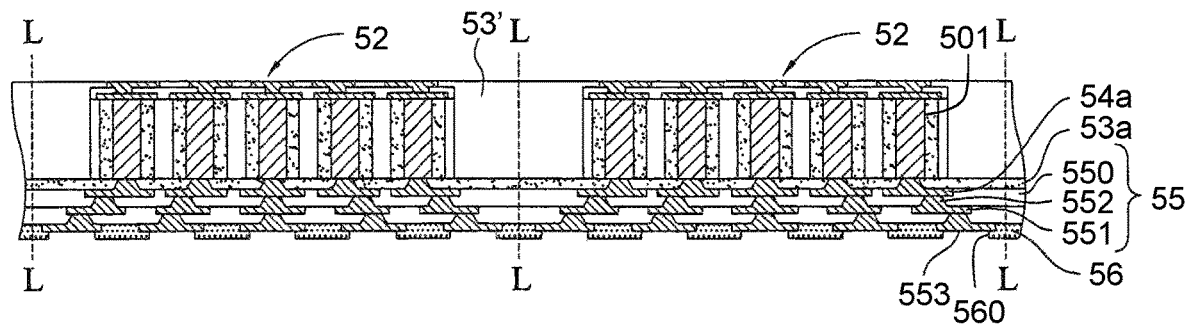

In addition, a circuit build-up structure 55 can also be manufactured as required, and singulation is subsequently performed. As shown in FIG. 5E, the circuit build-up structure 55 is formed on the second insulating layer 53a and the circuit layer 54a, and the circuit build-up structure 55 includes at least a dielectric layer 550, another circuit layer 551 formed on the dielectric layer 550, and additional conductive vias 552 formed in the dielectric layer 550 and electrically connected to the circuit layers 53a and 551.

Next, an insulating protective layer 56 is formed on the circuit build-up structure 55, and a plurality of openings 560 are formed in the insulating protective layer 56 for a portion of circuits of the circuit build-up structure (i.e. the circuit layer 551) exposing therefrom to be used as electrical contact pads 553.

If polymer materials (such as ABF) or the like are used for making the dielectric layer 550 and the first and second insulating layers 501 and 53a, then the well-known electroless copper plating technique in the art of circuit board manufacturing can be used to produce the circuit layer 551, thereby significantly reducing the production costs.

Figure 5F:
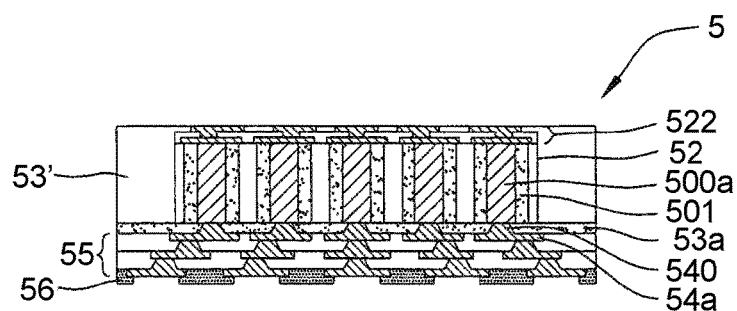
Figure 5F:
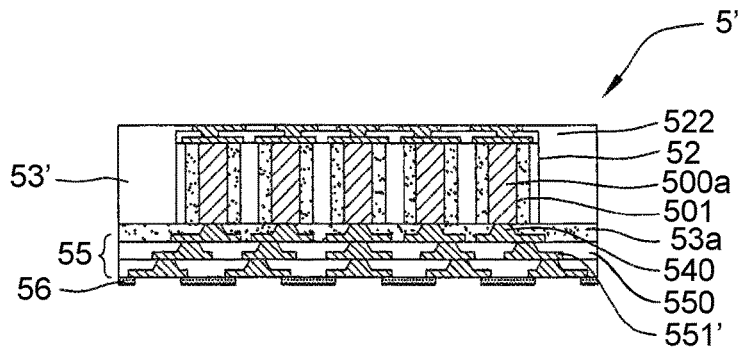

As shown in FIG. 5F, the singulation process is performed along cutting lines L shown in FIG. 5E to form the package substrate 5. A package substrate 5' according to another embodiment is shown in FIG. 5F'. When manufacturing the circuit build-up structure 55, the circuit layer 551' can be embedded into the dielectric layer 550 in order to reduce the height of the whole structure.

Figure 5G:
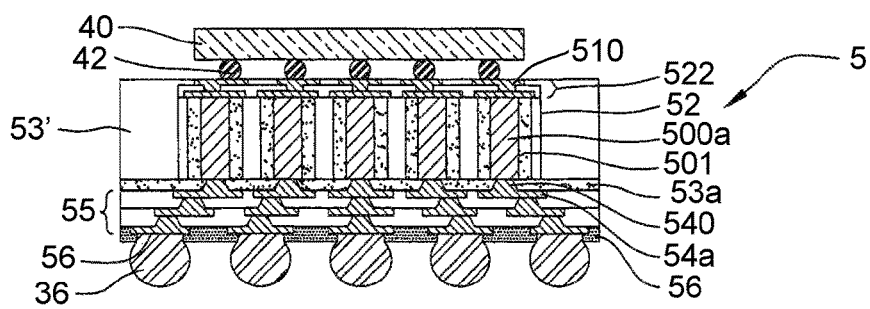
FIG. 5G is a cross-sectional diagram illustrating a subsequent application of the method for forming the package substrate in accordance with the present disclosure.

In a subsequent application, as shown in FIG. 5G, a semiconductor chip 40 can be mounted above the electrode pads 510 of the RDL 522 through conductive bumps 42 (e.g. solder bumps), and solder balls 36 are formed on each of the electrical contact pads such that the package substrate 5 is joined to a circuit board (not shown) via the solder balls 36.

Fifth Embodiment

Figure 6A:
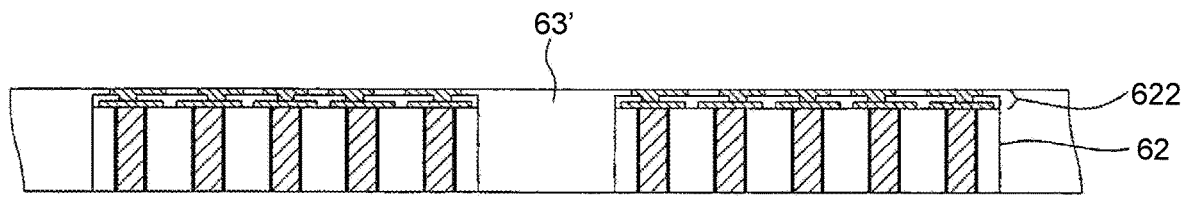
FIG. 6A to 6F illustrate a method of fabricating a package substrate of an embodiment according to the present disclosure.

FIGS. 6A to 6F illustrate a method of fabricating a package substrate of an embodiment according to the present disclosure. As shown in FIG. 6A, a molding layer 63' is formed to encapsulate the interposer 62 such that the interposer 62 is embedded in the molding layer 63', and the redistribution layer 622 is exposed from the molding layer 63'.

Figure 6B:
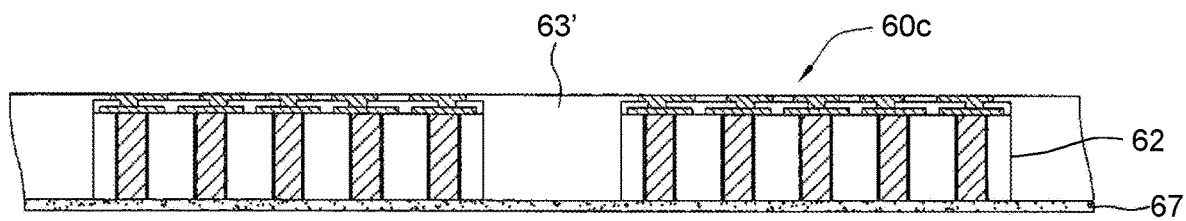

As shown in FIG. 6B, the photo-sensitive dielectric layer 67 is formed on the molding layer 63' and the second side 60c of the interposer 62.

Figure 6C:
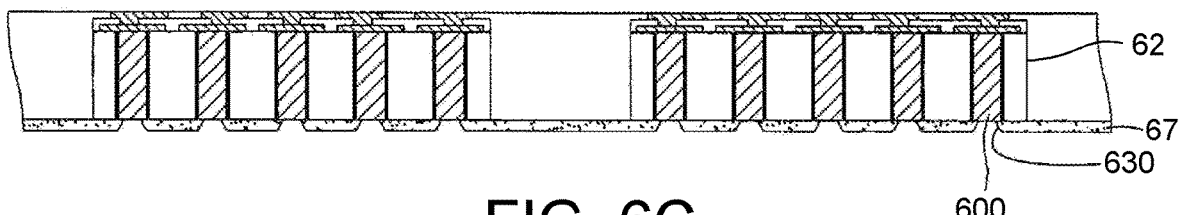
Figure 6C:
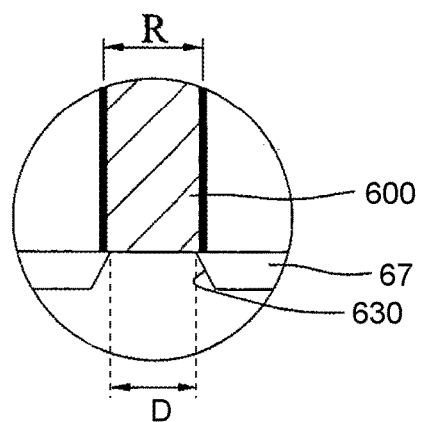

As shown in FIGS. 6C and 6C', a photo lithography process is performed to form in the photo-sensitive dielectric layer 67 at least one via 630 for the conductive through vias 600 to be exposed therefrom.

Figure 6D:
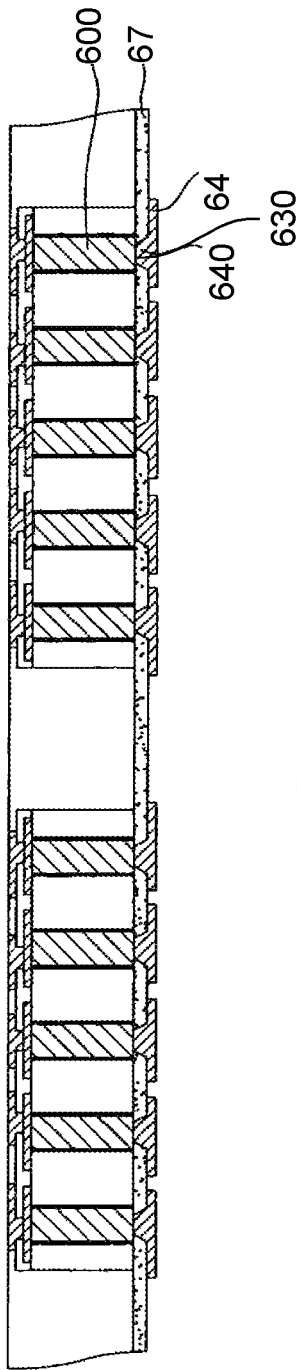

As shown in FIG. 6D, the circuit layer 64 is formed on the photo-sensitive dielectric layer 67, and the at least one conductive via 640 is formed in the at least one via 630 and electrically connected to the at least one conductive through via 640' and the circuit layer 64.

By means of performing the photo lithography process on the photo-sensitive dielectric layer 67, the at least one via 630 can have a diameter D as small as 10 μm, and the alignment accuracy may be maintained less than ±5 μm. Therefore, the location shift of the at least one via 630 is less than 10 μm, and the at least one via 630 can have the alignment accuracy increased. Accordingly, the at least one conductive through via 600 can have a diameter R as small as 20 μm.

The present disclosure can reduce the diameter of the at least one conductive through via 600 on demands. Therefore, the layout density of the at least one conductive through via 600 in the interposer 62 is increased, and the conductive material that is formed in the at least one conductive through via 600 is reduced, and the cost of the material and the electroplating process is reduced. Also, the material stress effect is reduced, the rate of the electroplating process is increased, and the reliability of the products is increased.

Thanks to the remarkable alignment accuracy of the photo lithography process, the at least one via 630 that has an extremely small diameter can be disposed exactly above the end surfaces of the at least one conductive through via 600 that also has an extremely small diameter. Therefore, the at least one conductive via 640 will not come into contact with the silicon material of the interposer 62, and the quality of electrical connection between the at least one conductive via 640 and the at least one conductive through via 600 is significantly improved.

The reduction of the diameter of the at least one via 630 also reduces the area of the photo-sensitive dielectric layer 67 where the end surface of the at least one via 630 occupies. Therefore, the layout area is increased, and the layout density of the circuit layer 64 is also increased.

Figure 6E:
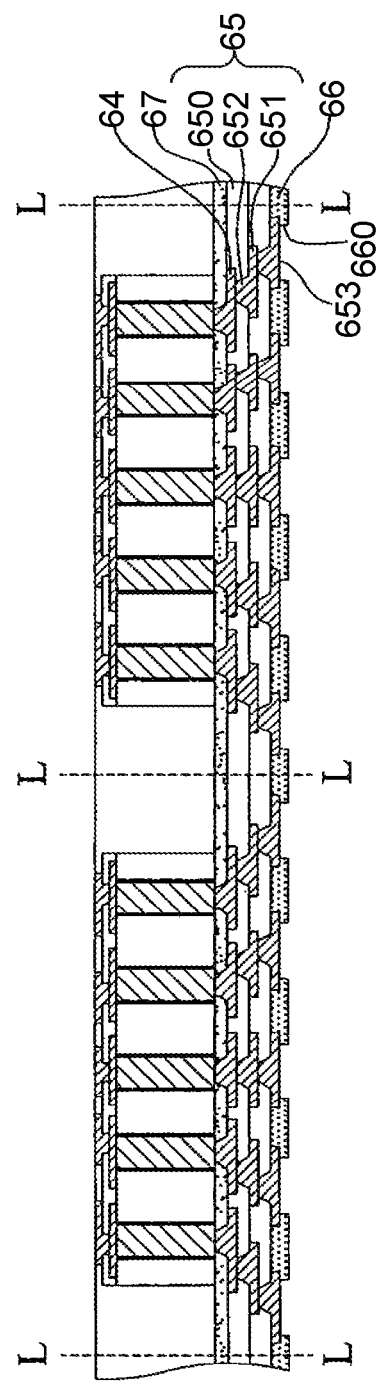

In an embodiment, a circuit built-up structure 65 is fabricated and a cutting process is performed on demands. As shown in FIG. 6E, the circuit built-up structure 65 is disposed on the photo-sensitive dielectric layer 67 and the circuit layer 64, and comprises at lease a dielectric layer 650, another circuit layer 651 formed on the dielectric layer 650, and another conductive vias 652 formed in the dielectric layer 650 and electrically connected to the circuit layers 64 and 651.

An insulating protection layer 66 is then formed on the circuit built-up structure 65, and has a plurality of opening 660 for exposing a portion of the circuit built-up structure 65 that serves as a conductive pad 653.

In general, a laser drilling technique is used to fabricate the vias of the conductive vias 652, and laser alignment marks are also fabricated accordingly. By contrast, when the circuit layer 64, the laser alignment marks and the photo-sensitive dielectric layer 67 can be fabricated at the same time. Therefore, additional process steps are omitted.

Figure 6F:
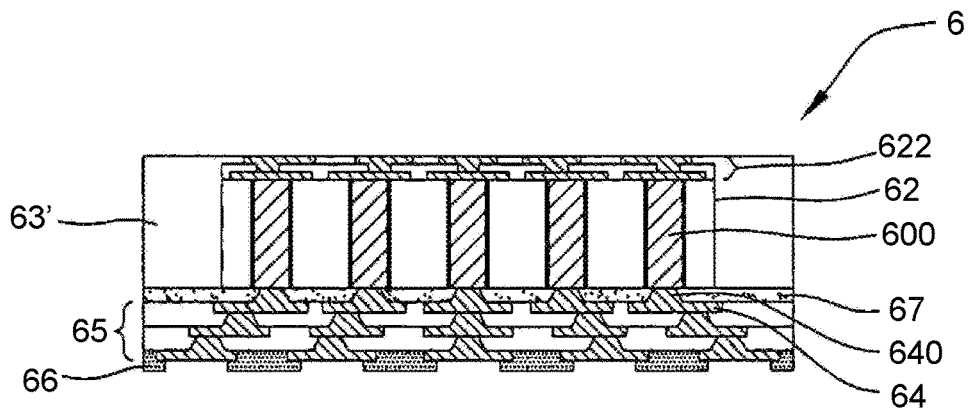
Figure 6F:
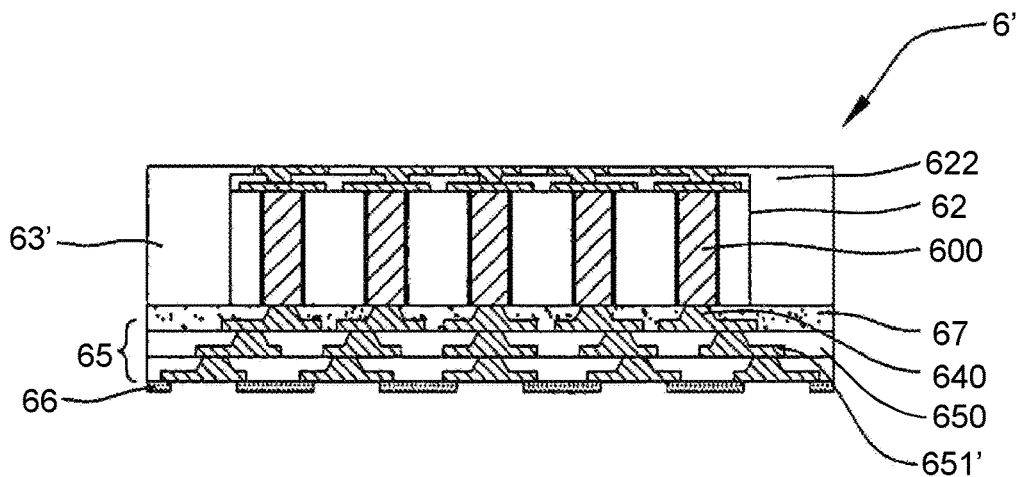

As shown in FIG. 6F, a cutting process is performed along a cutting line L, to form the package substrate 6. In fabricating another package substrate 6', as shown in FIG. 6F', the circuit layer 651' is embedded into the dielectric layer 650 when the circuit built-up structure 65 is fabricated such that the overall height is reduced.

Figure 6G:
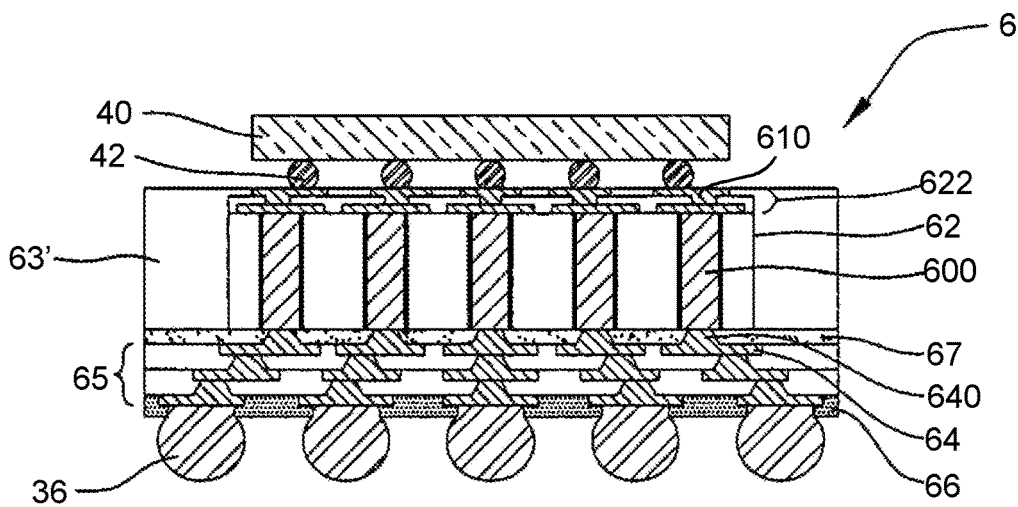
FIG. 6G is a cross-sectional view of a package substrate that is fabricated by the method according to the present disclosure.

In subsequent applications, as shown in FIG. 6G, a semiconductor chip 40 is mounted onto the electrode pads 610 of the redistribution layer 622 by the conductive bumps or conductive pillars 42, such as solder bumps or Cu pillars, and a solder ball 36 can be disposed on each of the conductive pads. Therefore, the package substrate 6 can be connected to a circuit board (not shown) through the solder balls 36.

Sixth Embodiment

The implementation of the sixth embodiment can be divided into two stages: firstly, an interposer is prepared; and secondly, a packaging substrate having an embedded interposer is fabricated. FIGS. 7A to 7L are schematic cross-sectional views showing a fabrication method of an interposer according to the sixth embodiment of the present disclosure.

Figure 7A:
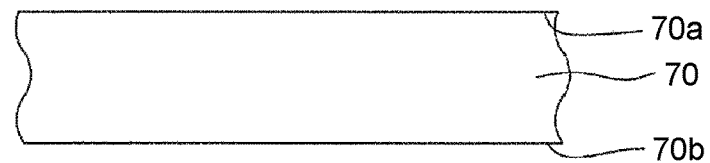
FIG. 7A to 7L are schematic cross-sectional views showing a fabrication method of an interposer according to the present disclosure, wherein FIGS. 7K' and 7L' show other embodiments of FIGS. 7K and 7L, respectively.

Referring to FIG. 7A, a plate 70 having opposite first and second surfaces 70a, 70b is provided. The plate 70 can be made of silicon, poly-silicon or other semiconductor material.

Figure 7B:
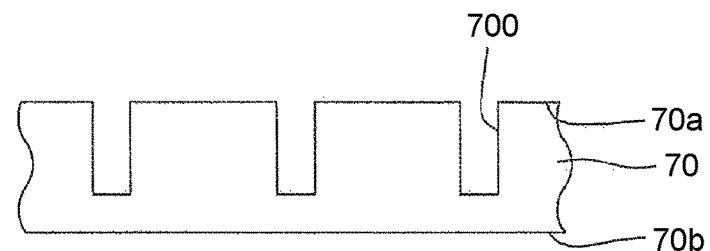

Referring to FIG. 7B, a plurality of trenches 700 are formed in the first surface 70a of the plate 70. To form the trenches 700, a coater, an aligner and a developer can be used to form on the first surface 70a, a photoresist layer (not shown) having a plurality of openings for exposing portions of the plate 70. Then, the exposed portions of the plate 70 are etched by deep reactive ion etching (DRIE) so as to form the trenches 700. Finally, the photoresist layer is removed by such as a stripper.

Figure 7C:
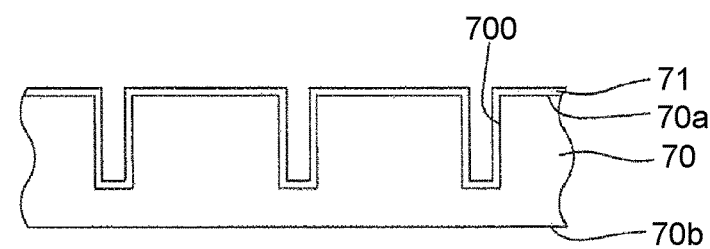

Referring to FIG. 7C, an insulating layer 71 made of such as silicon dioxide is formed on the first surface 70a and the surfaces of the trenches 700 through plasma enhanced chemical vapor deposition (PECVD) or furnace process.

Figure 7D:
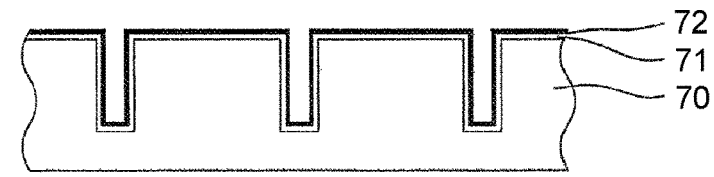

Referring to FIG. 7D, a conductive layer 72 is formed on the insulating layer 71 through such as sputtering.

Figure 7E:
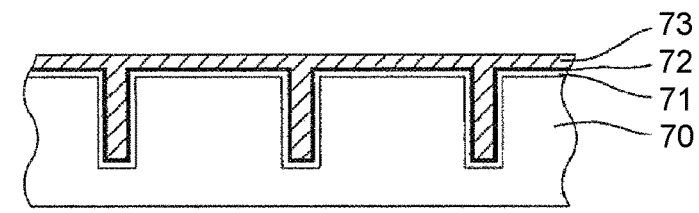

Referring to FIG. 7E, a metal layer 73 made of such as copper is formed on the conductive layer 72 through electroplating.

Figure 7F:
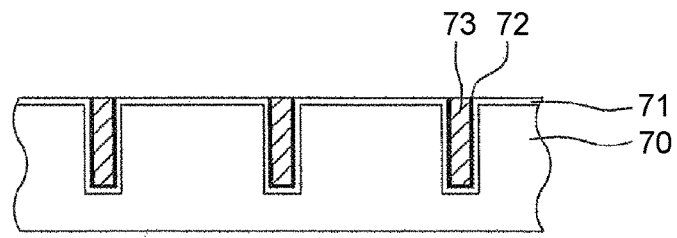

Referring to FIG. 7F, portions of the metal layer 73 and the conductive layer 72 higher than the top surface of the insulating layer 71 are removed by using such as a grinder, a polisher or through a chemical mechanical planarization (CMP) process.

Figure 7G:
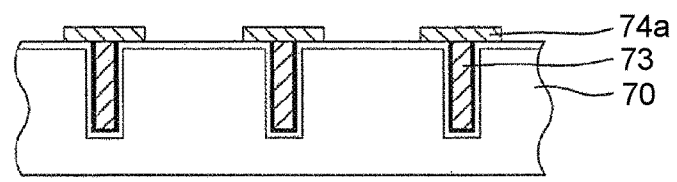

Referring to FIG. 7G, a plurality of first conductive pads 74a are formed on the remaining portions of the metal layer 73 so as for a semiconductor chip to be mounted thereon. According to the practical need, an under bump metallurgy (UBM) layer (not shown) can be formed on the first conductive pads 74a so as to improve the electrical connection reliability.

Figure 7H:
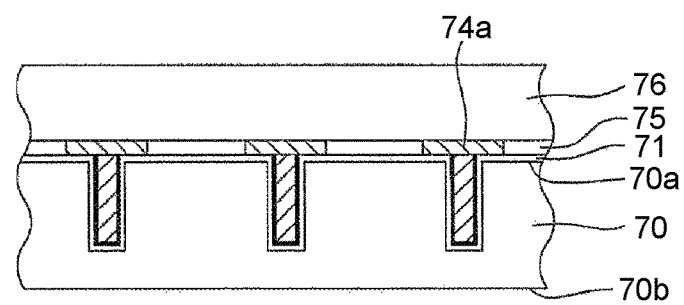

Referring to FIG. 7H, a first carrier 76 is attached to the insulating layer 71 and the first conductive pads 74a through an adhesive layer 75.

Figure 7I:
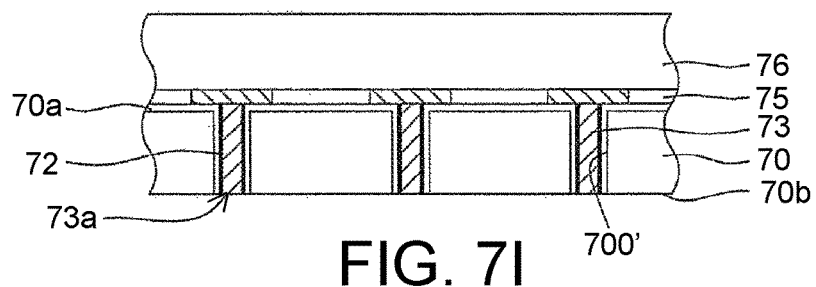

Referring to FIG. 7I, portions of the plate 70 and the insulating layer 71 are removed from the second surface 70b for exposing ends 73a of the metal layer 73, thereby forming a plurality of conductive through vias penetrating the first surface 70a and the second surface 70b of the plate 70. Each of the conductive through vias has a through hole 700' penetrating the first surface 70a and the second surface 70b, the insulating layer 71 formed on the sidewall of the through hole 700' and the metal layer 73 filling the through hole 700'.

Figure 7J:
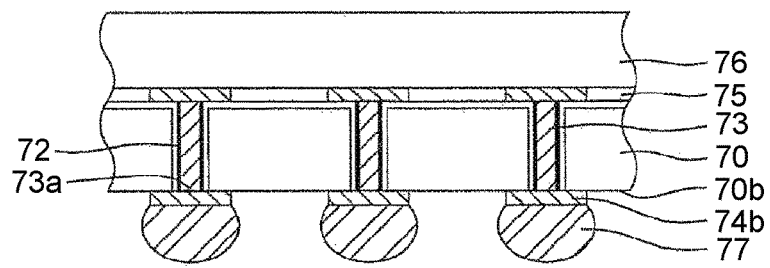

Referring to FIG. 7J, a plurality of second conductive pads 74b are formed on the exposed ends 73a of the metal layer 73, and a plurality of solder bumps 77 may be further formed on the second conductive pads 74b, but the invention is not limited thereto. According to the practical need, a UBM layer (not shown) can be first formed on the second conductive pads 74b and then the solder bumps 77 are formed on the UMB layer, thereby improving the electrical connection reliability.

Figure 7K:
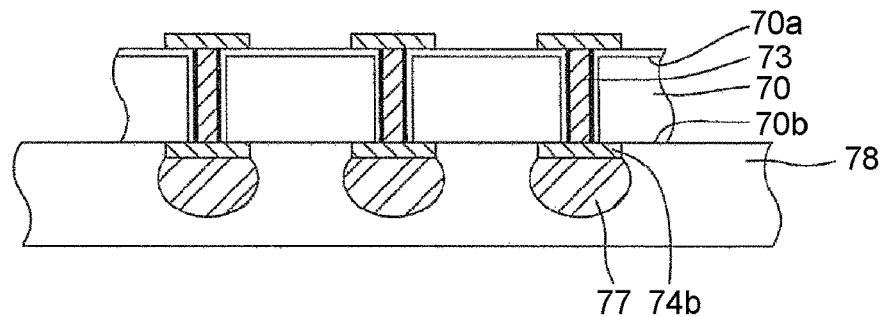
Figure 7K:
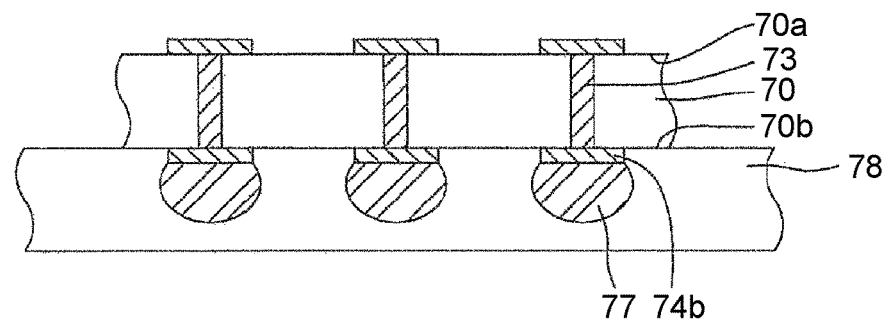

Referring to FIG. 7K, a second carrier 78 is disposed on the second surface 70b for covering the solder bumps 77, and the first carrier 76 and the adhesive layer 75 are removed.

In another embodiment, referring to FIG. 7K', the interposer does not have the insulating layer 71 and the conductive layer 72. That is, the metal layer 73 is directly formed to penetrate the plate 70. Therein, the plate 70 can be made of glass, ceramic such as $Al_2O_3$ or AlN. Preferably, the plate 70 is made of ceramic, since the coefficient of thermal expansion (CTE) of ceramic (approximately 3 ppm/° C.) is close to that of silicon.

Figure 7L:
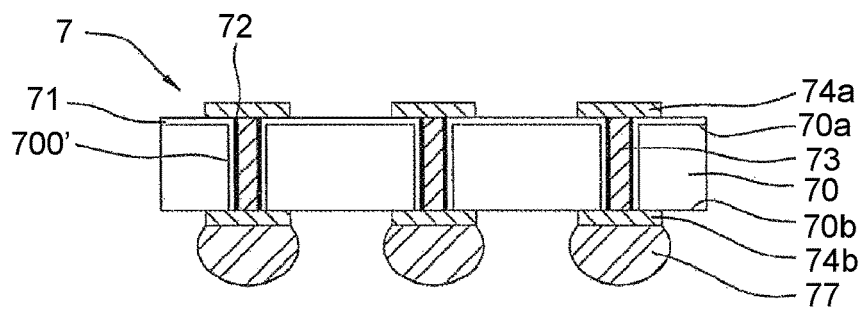
Figure 7L:
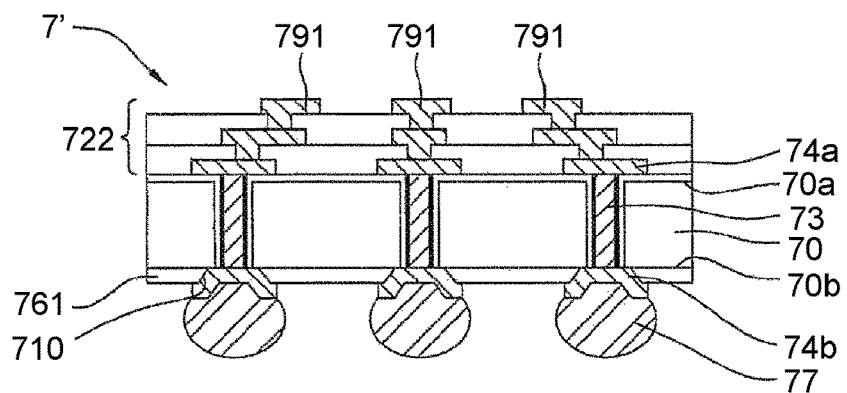

Referring to FIG. 7L, a cutting process is performed and the second carrier 78 is removed so as to obtain a plurality of interposers 7.

In another embodiment, referring to FIG. 7L', a plurality of first conductive pads 74a' are formed on the metal layer 73 and further a redistribution layer (RDL) 722 is formed on the first surface 70a and the first conductive pads 74a'. The outermost sub-layer of the redistribution layer 722 has a plurality of extensive conductive pads 791 so as for a semiconductor chip to be mounted thereon and electrically connected thereto. Moreover, a dielectric layer 761 can be formed on the second surface 70b. The dielectric layer 761 has a plurality of openings 710 for exposing the metal layer 73, and a plurality of second conductive pads 74b' are formed in the openings 710, respectively. In this embodiment, referring to FIG. 7L', the second conductive pad 74b' formed in the opening 710 has the shape of an inverted cup.

FIGS. 8A to 8G are schematic cross-sectional views showing a packaging substrate having an embedded interposer and a fabrication method thereof.

Figure 8A:
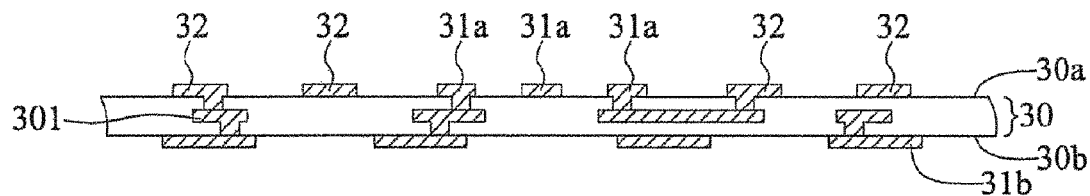
FIG. 8A to 8G are schematic cross-sectional views showing a fabrication method of a packing substrate having an embedded interposer according to the present disclosure, wherein FIG. 8F' shows another embodiment of FIG. 8F, and FIGS. 8G-1', 8G-2, 8G-3, 8G-4 and 8G-5 show other embodiments of FIG. 8G-1.

Referring to FIG. 8A, a multi-layer interconnect base plate 30 is provided. The multi-layer interconnect base plate 30 has opposite third and fourth surfaces 30a, 30b and at least a circuit layer 301. The third surface 30a has a plurality of first conductive terminals 31a and a plurality of third conductive pads 32, and the fourth surface 30b has a plurality of second conductive terminals 31b. The circuit layer 301, the first conductive terminals 31a, the third conductive pads 32 and the second conductive terminals 31b can be made of copper. According to the practical need, a UBM layer (not shown) can be formed on the first conductive terminals 31a and the second conductive terminals 31b for improving the electrical connection reliability.

Figure 8B:
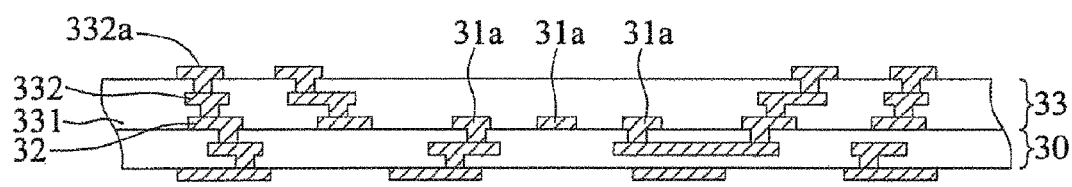

Referring to FIG. 8B, a built-up structure 33 is formed on the third surface 30a. The built-up structure 33 has a dielectric layer 331, a circuit layer 332 formed on the dielectric layer 331 and a plurality of conductive pads 332a exposed from the dielectric layer 331 and electrically connected to the circuit layer 332 and the third conductive pads 32. The dielectric layer 331 can be made of ABF (Ajinomoto Build-up Film) or BT (Bismaleimide-Triazine). The circuit layer 332 and the conductive pads 332a can be made of copper.

Figure 8C:
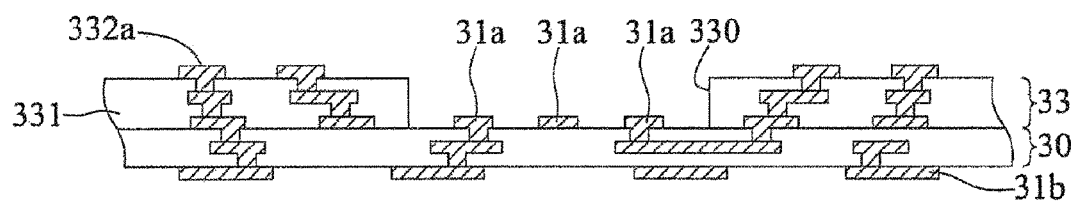

Referring to FIG. 8C, portions of the dielectric layer 331 are removed through such as laser so as to form a cavity 330 exposing the first conductive terminals 31a.

Figure 8D:
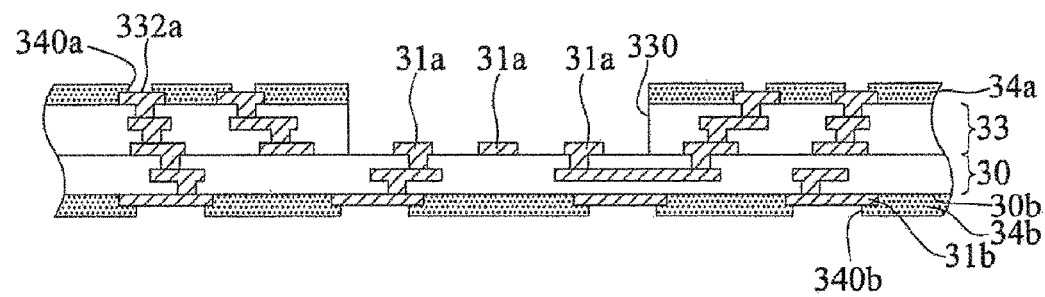

Referring to FIG. 8D, a first insulating protection layer 34a is formed on the built-up structure 33. The first insulating protection layer 34a has a plurality of first openings 340a for exposing the conductive pads 332a, respectively. A second insulating protection layer 34b is formed on the fourth surface 30b and has a plurality of second openings 340b for exposing the second conductive terminals 31b, respectively.

In another embodiment, the structure of FIG. 8D can be simplified as or viewed as a carrier, which has a top surface (such as the top of the built-up structure 33) and a bottom surface (the fourth surface 30b of the multi-layer interconnect base plate 30) and a recess formed on the top surface. The bottom surface of the carrier has a plurality of conductive terminals for electrically connecting an external electronic device, and the bottom of the recess has a plurality of conductive terminals for electrically connecting the interposer 8.

Figure 8E:
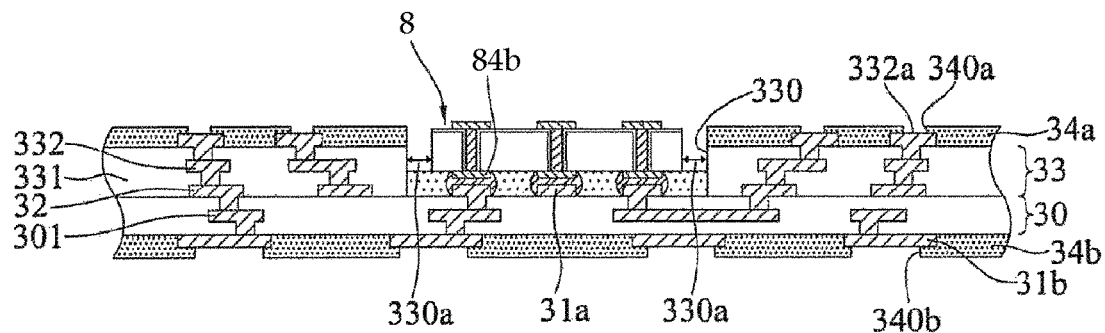

Referring to FIG. 8E, the interposer 8 is disposed in the cavity 330 with the second conductive pads 84b electrically connected to the first conductive terminals 31a, respectively. A stress relief gap 330a is formed between the interposer 8 and the sidewall of the cavity 330. An underfill 35 is filled between the interposer 8 and the bottom of the cavity 330 so as to obtain a packaging substrate having an embedded interposer.

Figure 8F:
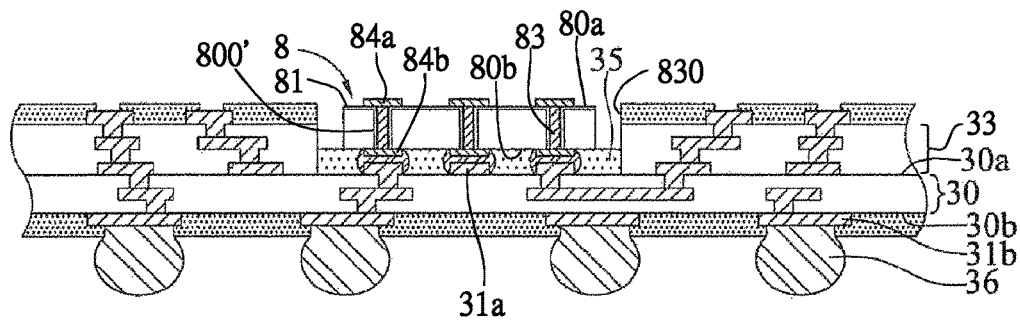
Figure 8F:
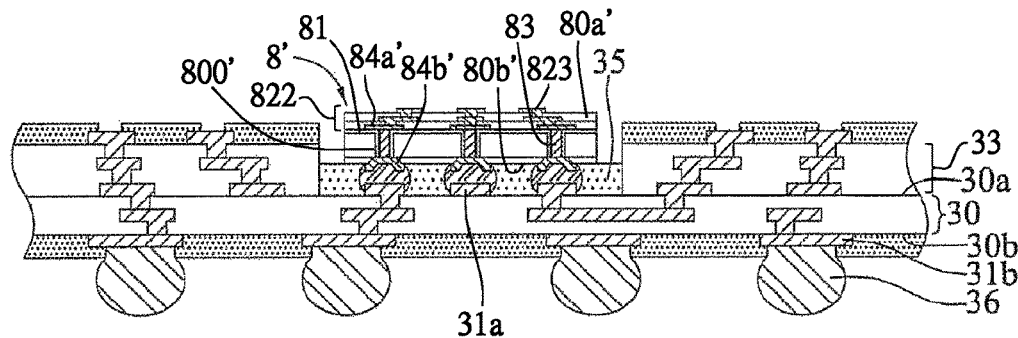

Referring to FIG. 8F, a plurality of solder balls 36 can further be mounted on the second conductive terminals 31b. Alternatively, the interposer 8' of FIG. 8F is replaced with the interposer 8 so as to obtain a structure of FIG. 8F'.

Figures 1, 8G:
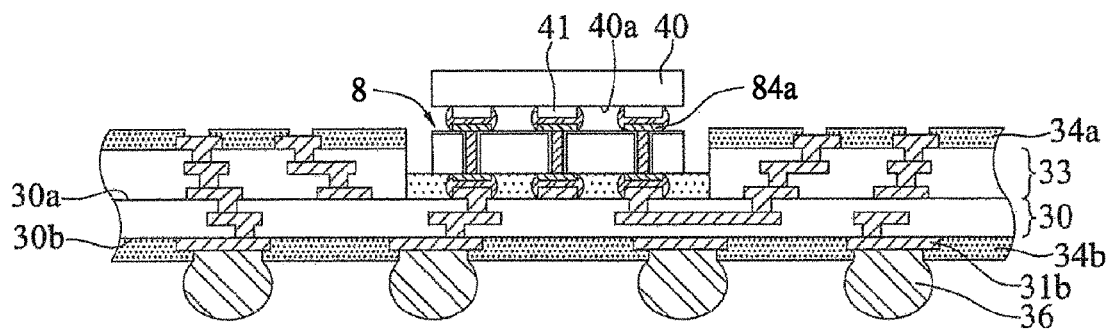
Figures 1, 8G:
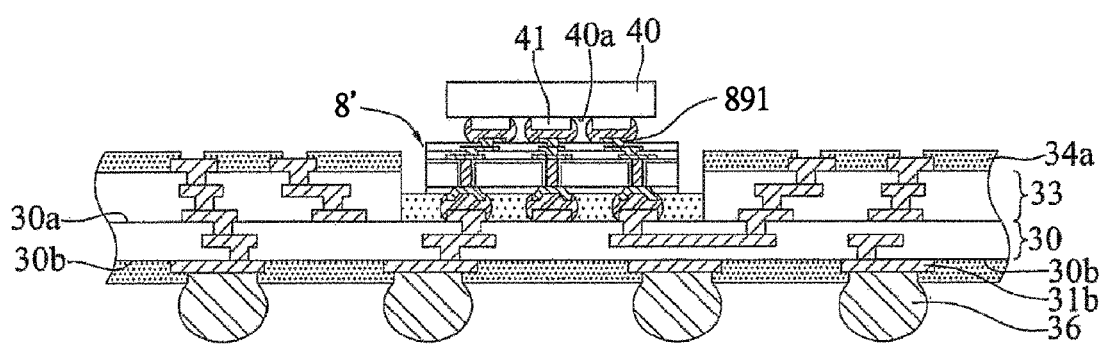

Referring to FIGS. 8G-1 and 8G-1' that are continued from FIGS. 8F and 8F', respectively, a semiconductor chip 40 having an active surface 40a with a plurality of electrode pads 41 is disposed on the interposer 8. The electrode pads 41 of the active surface 40a are electrically connected to the first conductive pads 84a (FIG. 8G-1), respectively, or electrically connected to the extensive conductive pads 891 (FIG. 8G-1').

Figures 2, 8G:
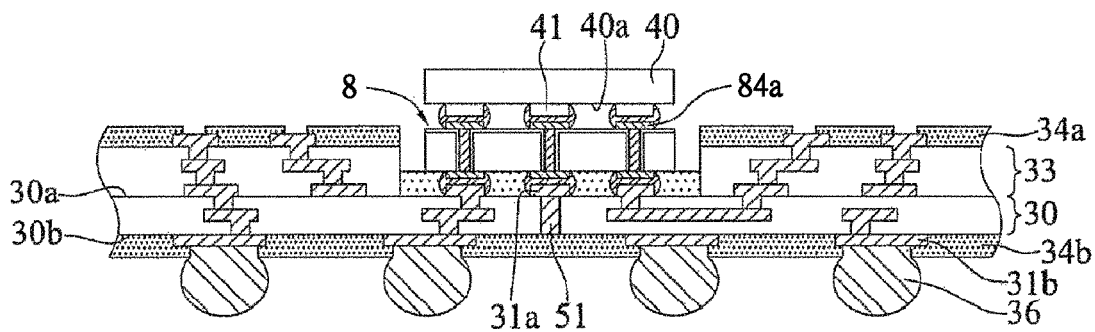
Figures 3, 8G:
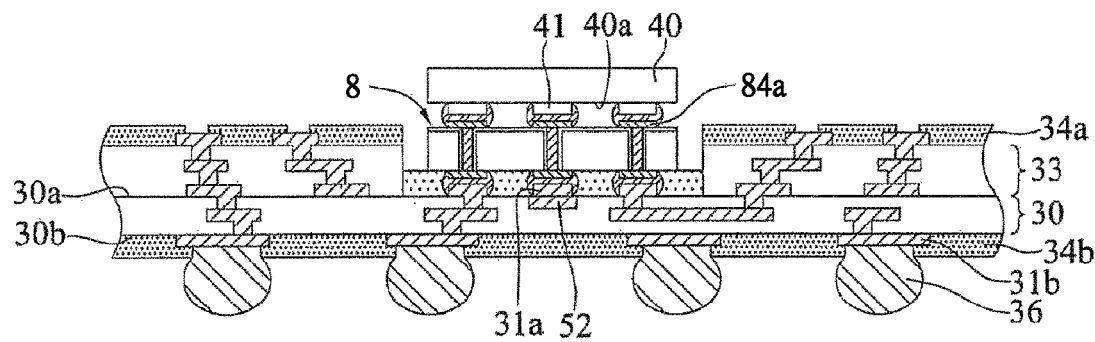
Figures 4, 8G:
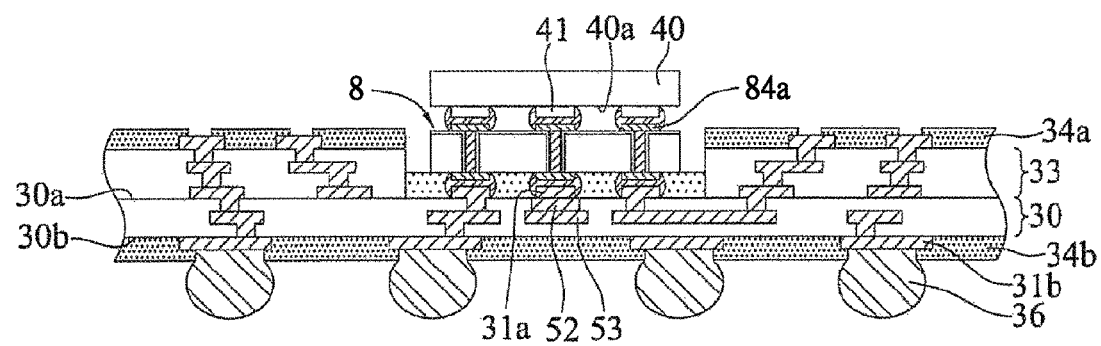

Referring to FIG. 8G-2, the multi-layer interconnect base plate 30 of FIG. 8G-1 further has at least a metal pillar 51 penetrating the third and fourth surfaces 30a, 30b and electrically connecting at least one of the first conductive terminals 31a.

Referring to FIG. 8G-3, the multi-layer interconnect base plate 30 of FIG. 8G-1 further has at least a metal bump 52 disposed therein and electrically connecting at least one of the first conductive terminals 31a.

Referring to FIG. 8G-4, the multi-layer interconnect base plate 30 of FIG. 8G-3 further has a metal plate 53 disposed therein and electrically connecting the bottom of the at least a metal bump 52.

Figures 5, 8G:
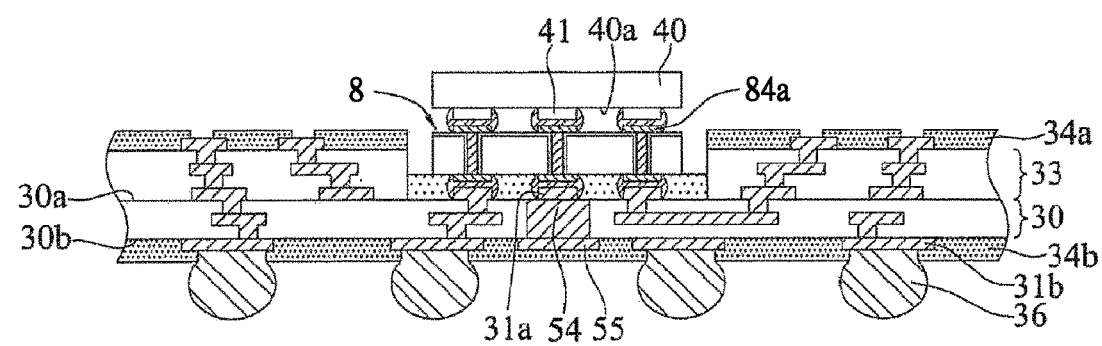

Referring to FIG. 8G-5, the multi-layer interconnect base plate 30 of FIG. 8G-1 further has at least a metal bump 54 penetrating the third and fourth surfaces 30a, 30b and connecting one of the first conductive terminals 31*a*, and a metal plate 55 disposed on the fourth surface 30*b* and electrically connecting at least a the metal bump 54.

It should be noted that the metal pillar 51, the metal bump 52, the metal plate 53, the metal bump 54 and the metal plate 55 are used to improve the heat dissipating effect so as to protect the packaging substrate from being damaged by overheating.

The present disclosure further provides a packaging substrate having an embedded interposer, as shown in FIG. 8F. The packaging substrate has a carrier and an interposer 8. The carrier has opposite top and bottom surfaces. A recess is formed on the top surface of the carrier. A plurality of first conductive terminals 31*a* are formed on the bottom of the recess, and a plurality of second conductive terminals 31*b* are formed on the bottom surface of the carrier for electrically connecting the carrier and an external electronic device. The interposer 8 is disposed in the recess and has opposite first and second surfaces 80*a*, 80*b*, and a plurality of conductive through vias penetrating the first and second surfaces 80*a*, 80*b*. A first conductive pad 84*a* is disposed on an end of each of the conductive through vias exposed from the first surface 80*a* so as for a semiconductor chip to be mounted and electrically connected thereto, and a second conductive pad 84*b* is disposed on the other end of each of the conductive through vias exposed from the second surface 80*b* and is electrically connected to a corresponding one of the first conductive terminals 31*a*.

The present disclosure provides another packaging substrate having an interposer. Referring to FIG. 8F', the packaging substrate has a carrier and an interposer 8'. The carrier has opposite top and bottom surfaces. A recess is formed on the top surface of the carrier and a plurality of first conductive terminals 31*a* are formed on the bottom of the recess, and a plurality of second conductive terminals 31*b* are formed on the bottom surface of the carrier for electrically connecting the carrier and an external electronic device. The interposer 8' is disposed in the recess and has opposite first and second surfaces 80*a*', 80*b*' and a plurality of conductive through vias penetrating the first and second surfaces 80*a*', 80*b*'. A first conductive pad 84*a*' is formed on an end of each of the conductive through vias exposed from the first surface 80*a*', and a second conductive pad 84*b*' is formed on the other end of each of the conductive through vias exposed from the second surface 80*b*' and electrically connected to a corresponding one of the first conductive terminals 31*a*. Further, a redistribution layer 822 is formed on the first surface 80*a* and the first conductive pads 84*a*', and the outermost sub-layer of the redistribution layer 822 has a plurality of extensive conductive pads 823 so as for a semiconductor chip to be mounted thereon and electrically connected thereto.

In the above-describe packaging substrates, each of the conductive through vias can have a through hole 800' penetrating the first surface 80*a*, 80*a*' and the second surface 80*b*, 80*b*', an insulating layer 81 formed on the sidewall of the through hole 800', and a metal layer 83 filling the through hole 800'.

In the above-described packaging substrates, the carrier can have a multi-layer interconnect base plate 30 and a built-up structure 33. The multi-layer interconnect base plate 30 has a third surface 30*a* and a fourth surface 30*b* opposite to the third surface 30*a*. The built-up structure 33 is formed on the third surface 30*a* and has a cavity 330 for exposing a portion of the multi-layer interconnect base plate 30.

The packaging substrates can further have an underfill 35 formed between the interposer 8, 8' and the bottom of the recess.

In the above-described packaging substrates, referring to FIG. 8G-2, the multi-layer interconnect base plate 30 can further have at least a metal pillar 51 penetrating the third and fourth surfaces 30*a*, 30*b* and electrically connecting at least one of the first conductive terminals 31*a*.

Referring to FIG. 8G-3, the multi-layer interconnect base plate 30 can further have at least a metal bump 52 disposed therein and electrically connecting at least one of the first conductive terminals 31*a*. Referring to FIG. 8G-4, the multi-layer interconnect base plate 30 can further have a metal plate 53 disposed therein and electrically connecting the at least a metal bump 52.

Referring to FIG. 8G-5, the multi-layer interconnect base plate 30 can further have at least a metal bump 54 penetrating the third and fourth surfaces 30*a*, 30*b* and electrically connecting at least one of the first conductive terminals 31*a*. The multi-layer interconnect base plate 30 can further have a metal plate 55 disposed therein and electrically connecting the at least a metal bump 54.

Referring to FIG. 8F, a stress relief gap 830 can be formed between the interposer 8 and the sidewall of the recess.

It should be noted that the external electronic device can be a circuit board or other packaging structure. Although a coreless carrier is exemplified herein, it is not intended to limit the present disclosure. A carrier having a core can also be applied in the present disclosure. In addition, although solder balls are used herein for electrically connecting the interposer and the carrier, the interposer and the semiconductor chip, and the carrier and the external electronic device, the present disclosure is not limited to the solder balls. Other electrical connection methods can be alternatively used.

Therefore, by providing the interposer, the present disclosure provides a packaging substrate suitable for a semiconductor chip having high-density nano-scale circuits without changing original supply chains and infrastructures of IC industries. Further, since the CTEs of the interposer and the semiconductor chip are close to each other, the present disclosure prevents large thermal stresses from occurring between the semiconductor chip and the interposer, thereby effectively improving the product reliability. In addition, the present disclosure embeds the interposer in the packaging substrate so as to reduce the thickness of the overall structure. Furthermore, by embedding a metal post, a metal bump or a metal plate in the packaging substrate, the present disclosure facilitates dissipation of heat generated by the packaging substrate and the semiconductor chip, thus avoiding damages of the packaging substrate that would otherwise occur due to large thermal stresses during a thermal cycling test or during the use of the product.

Figure 9A:
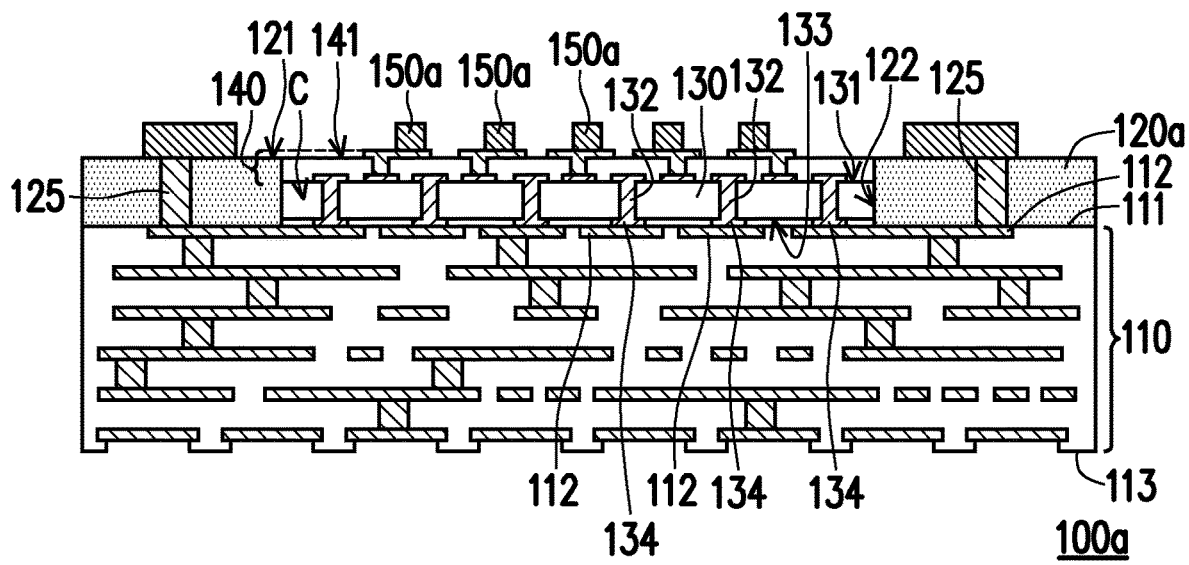
FIG. 9A to FIG. 9J are cross-sectional view of a package substrate according to various embodiment of the present disclosure.

FIG. 9A is a cross-sectional view of a package substrate according to an embodiment of the present disclosure. Referring to FIG. 9A, in the present embodiment, the package substrate 100*a* includes a substrate 110, an insulating protective layer 120*a* and an interposer 130. The substrate 110 has a first surface 111 and a second surface 113 opposing to the first surface 111. The substrate 110 includes a plurality of first conductive pads 112 embedded in the first surface 111. The insulating protective layer 120*a* is disposed on the first surface 111 of the substrate 110. The insulating protective layer 120*a* has an opening 122 for exposing a portion of the first conductive pads 112 embedded in the first surface 111 of the substrate 110. The interposer 130 has a top surface 131 and a bottom surface 133 opposing to the top surface 131. The interposer 130 includes a plurality of conductive vias 132 and a plurality of second conductive pads 134 located on the bottom surface 133. The interposer 130 is located in a recess C defined by the opening 122 of the insulating protective layer 120a and the first surface 111 of the substrate 110. Each of the second conductive pads 134 is electrically connected to corresponding first conductive pad 112.

In the embodiment, referring to FIG. 9A, the interposer 130 can be bonded to the first surface 111 of the substrate 110 by, for example, dielectric-to-dielectric bonding, metal-to-metal bonding or hybrid bonding. The dielectric-to-dielectric bonding process creates an oxide-to-oxide bond or organic-to-organic bond through a cleaning and/or surface activation process followed by applying pressure, heat and/or other bonding process steps to the joined surfaces. In dielectric-to-dielectric bonding applications, the interface between the interposer 130 and the first surface 111 of the substrate 110 may be substantially free of any conductive elements. In an embodiment, the interposer 130 may be bonded to the first surface 111 of the substrate 110 by metal-to-metal bonding that is achieved by fusing conductive elements, such as metal bond pads 134 and/or 112, located between the bottom surface 133 of the interposer 130 and the first surface 111 of the substrate 110. In an embodiment, the interposer 130 may be bonded to the first surface 111 of the substrate 110 by hybrid bonding which is a combination of dielectric-to-dielectric bonding and metal-to-metal bonding. In an embodiment, the bonded structures may be baked, annealed or pressed to strengthen the bonded structures.

Furthermore, referring to FIG. 9A again, the package substrate 100a in the present embodiment further includes a wiring redistribution layer 140 located in the recess C and covering the interposer 130, wherein a first surface 141 of the wiring redistribution layer 140 and a second surface 121 of the insulating protective layer 120a may be coplanar by applying a planarization process thereto. In one embodiment, the interposer 130 can be made of glass, ceramic, single crystal silicon or polysilicon, but the invention is not limited thereto. When the interposer 130 is made of single crystal silicon, polysilicon or electric conducting materials, each of the conductive vias 132 has an insulating layer (not shown) formed on the side wall thereof. In other embodiment, the interposer 130 may include integrated circuits formed therein, the integrated circuits may include transistors, memory cells, logic circuits, etc. In other words, the interposer 130 can be an active interposer.

In addition, the package substrate 100a in the present embodiment further includes a plurality of conductive micro-bumps 150a disposed on the wiring redistribution layer 140, wherein the conductive micro-bumps 150a are separated from each other and electrically connected to the wiring redistribution layer 140. Moreover, the package substrate 100a further includes a plurality of conductive columns 125 disposed in the insulating protective layer 120a, wherein the conductive columns 125 are respectively penetrating the insulating protective layer 120a, and the conductive columns 125 are respectively electrically connected to the first conductive pads 112 of the substrate 110. Herein, a material of the conductive micro-bump 150a includes, for example, solder alloy, copper, silver, indium, gold, palladium, titanium, manganese, cobalt or an alloy thereof, but the invention is not limited thereto.

It should be mentioned here that, the following embodiments adopt the reference numerals of the embodiments above and a portion of the content thereof, wherein the same reference numerals are used to represent the same or similar elements and descriptions of the same technical content are omitted. The omitted portions are as described in the embodiments above and are not repeated in the embodiments below.

Figure 9B:
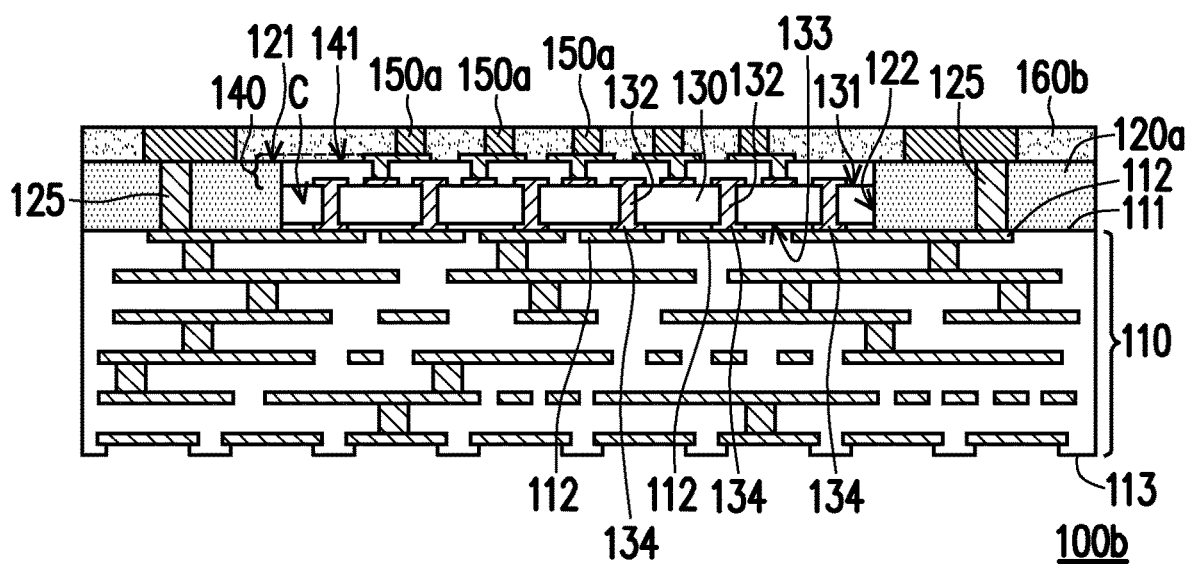

FIG. 9B is a cross-sectional view of a package substrate according to an embodiment of the present disclosure. Referring to FIG. 9B and FIG. 9A at the same time, a package substrate 100b of the present embodiment is similar to the package substrate 100a of FIG. 9A, and the package substrate 100b further includes an organic dielectric layer 160b covering the wiring redistribution layer 140, the insulating protective layer 120a and the conductive micro-bumps 150a. Herein, a material of the insulating protective layer 120a may include organic materials or inorganic materials, wherein the organic materials applied to the insulating protective layer 120a includes, for example, epoxy molding compound (EMC), Polyimide (PI) or Ajinomoto build-up film (ABF), but the invention is not limited thereto; the inorganic materials applied to the insulating protective layer 120a includes, for example, Silicon-Oxide (SiOx), Silicon-Nitride (SiNx), Ceramic materials, etc., but the invention is not limited thereto. Herein, a material of the organic dielectric layer 160b includes, for example, epoxy molding compound (EMC), Polyimide (PI) or Ajinomoto build-up film (ABF), but the invention is not limited thereto.

Figure 9C:
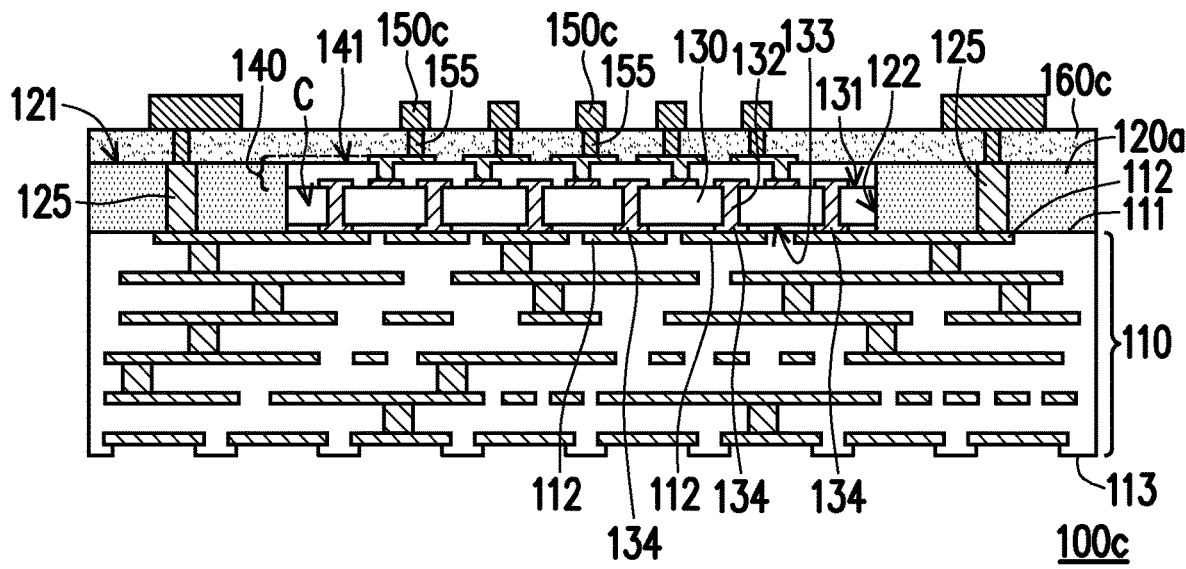

FIG. 9C is a cross-sectional view of a package substrate according to an embodiment of the present disclosure. Referring to FIG. 9C and FIG. 9A at the same time, a package substrate 100c of the present embodiment is similar to the package substrate 100a of FIG. 9A, and the package substrate 100c further includes a plurality of conductive micro-pillars 155 disposed on the wiring redistribution layer 140. Furthermore, the package substrate 100c in the present embodiment further includes an organic dielectric layer 160c covering the wiring redistribution layer 140, the insulating protective layer 120a and the conductive micro-pillars 155. Herein, a material of the organic dielectric layer 160c includes, for example, epoxy molding compound (EMC) or Ajinomoto build-up film (ABF), but the invention is not limited thereto. The conductive micro-bumps 150c are disposed on the organic dielectric layer 160c and connected to the conductive micro-pillars 155, respectively, for repositioning. In another embodiment, the conductive micro-pillars 155 can be disposed in the insulating protective layer 120a.

Figure 9D:
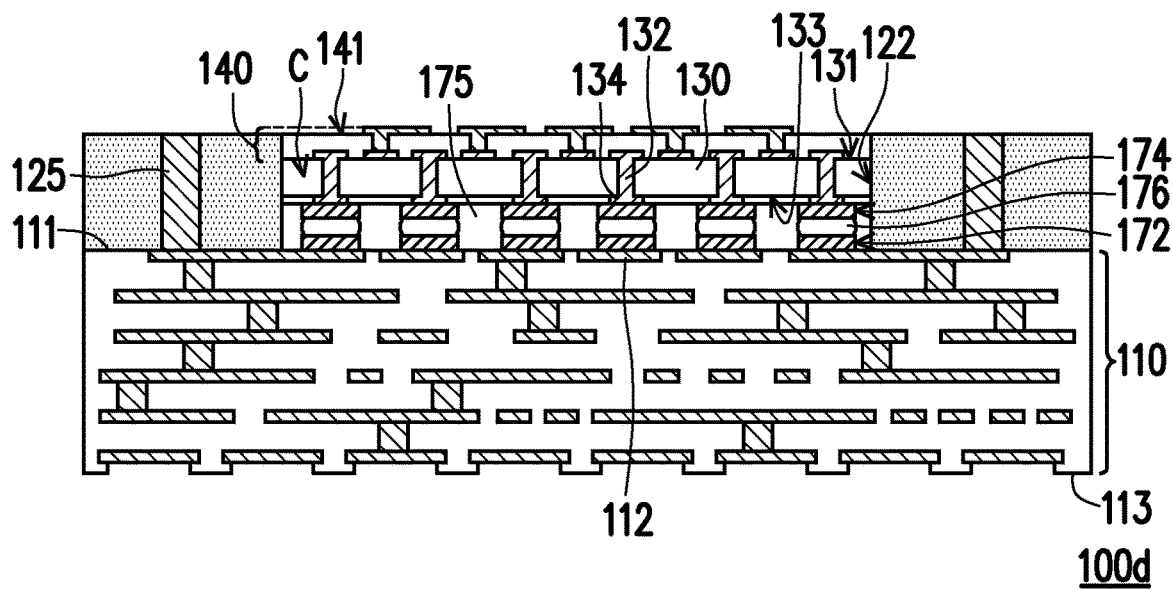

FIG. 9D is a cross-sectional view of a package substrate according to an embodiment of the present disclosure. Referring to FIG. 9D and FIG. 9A at the same time, a package substrate 100d of the present embodiment is similar to the package substrate 100a of FIG. 9A, and the package substrate 100d is provided with a first metal layer 172 disposed between the first conductive pads 112 of the substrate 110 and the second conductive pads 134 of the interposer 130. Furthermore, the package substrate 100d further includes a second metal layer 174, wherein the first metal layer 172 is disposed on the first conductive pads 112 of the substrate 110, and the second metal layer 174 is disposed on the second conductive pads 134 of the interposer 130. The first metal layer 172 and the second metal layer 174 are eutectic joined by the solder 176. In other words, the interposer 130 and the substrate 110 are bonded together through eutectic bonding. In addition, the package substrate 100d further includes a filling layer 175 disposed between the substrate 110 and the interposer 130 to encapsulate the firs metal layer 172, the second metal layer 174 and the solder 176.

Figure 9E:
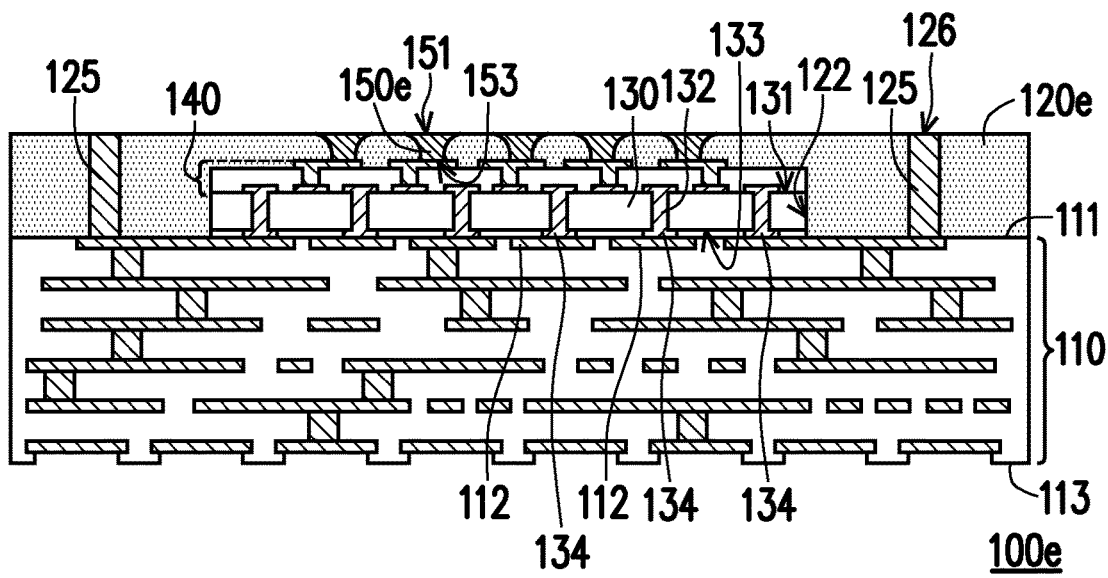

FIG. 9E is a cross-sectional view of a package substrate according to an embodiment of the present disclosure. Referring to FIG. 9E and FIG. 9A at the same time, a package substrate 100e of the present embodiment is similar to the package substrate 100a of FIG. 9A, and the insulating protective layer 120e covers the first surface 111 of the substrate 110, the wiring redistribution layer 140, the interposer 130 and the conductive column 125. A first upper end 151 of the conductive micro-bump 150e and a second upper end 126 of the conductive column 125 are exposed from the insulating protective layer 120e. In some cases, due to the Planarization process, for example Chemical Mechanical Planarization (CMP) process, applied to the insulating protective layer 120e, the first upper end 151 of the conductive micro-bump 150e exposed from the insulating protective layer 120e may be deformed, and therefore, the first upper end 151 of the conductive micro-bump 150e may become wider than a first lower end 153 of the conductive micro-bump 150e.

Figure 9F:
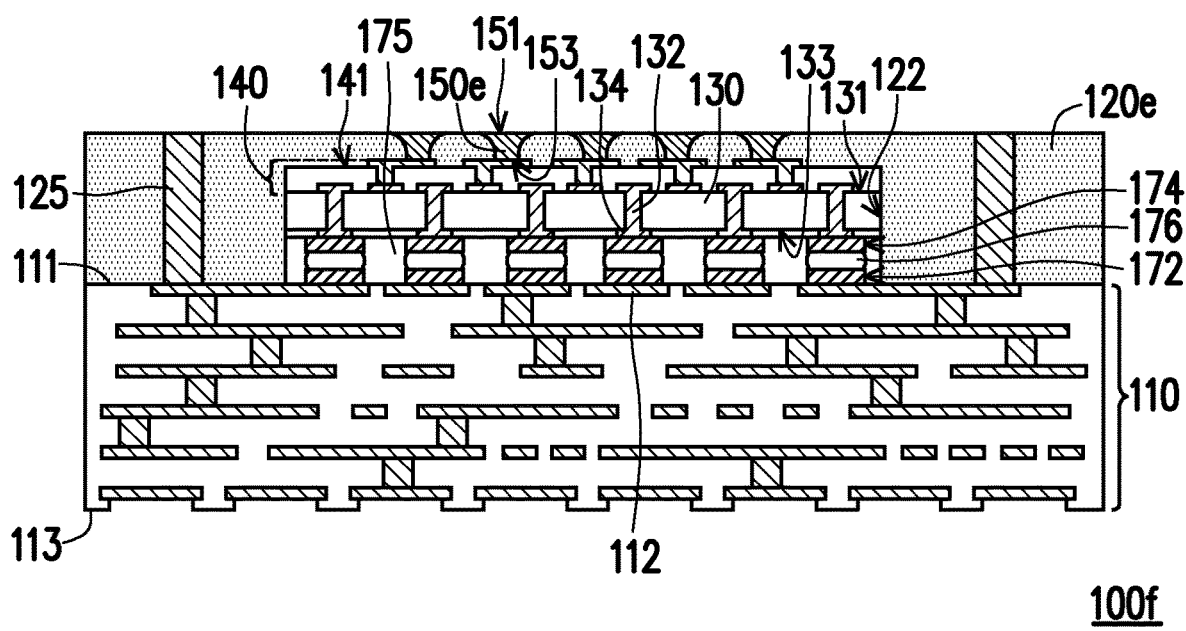

FIG. 9F is a cross-sectional view of a package substrate according to an embodiment of the present disclosure. Referring to FIG. 9F and FIG. 9E at the same time, a package substrate 100f of the present embodiment is similar to the package substrate 100e of FIG. 9E, and the package substrate 100f further includes a first metal layer 172 disposed between the first conductive pads 112 of the substrate 110 and the second conductive pads 134 of the interposer 130. Furthermore, the package substrate 100f further includes a second metal layer 174, wherein the first metal layer 172 is disposed on the first conductive pads 112 of the substrate 110, and the second metal layer 174 is disposed on the second conductive pads 134 of the interposer 130. The first metal layer 172 and the second metal layer 174 are eutectic joined by the solder 176. In other words, the interposer 130 and the substrate 110 are bonded together through eutectic bonding. In addition, the package substrate 100f further includes a filling layer 175 disposed between the substrate 110 and the interposer 130 to encapsulate the firs metal layer 172, the second metal layer 174 and the solder 176.

Figure 9G:
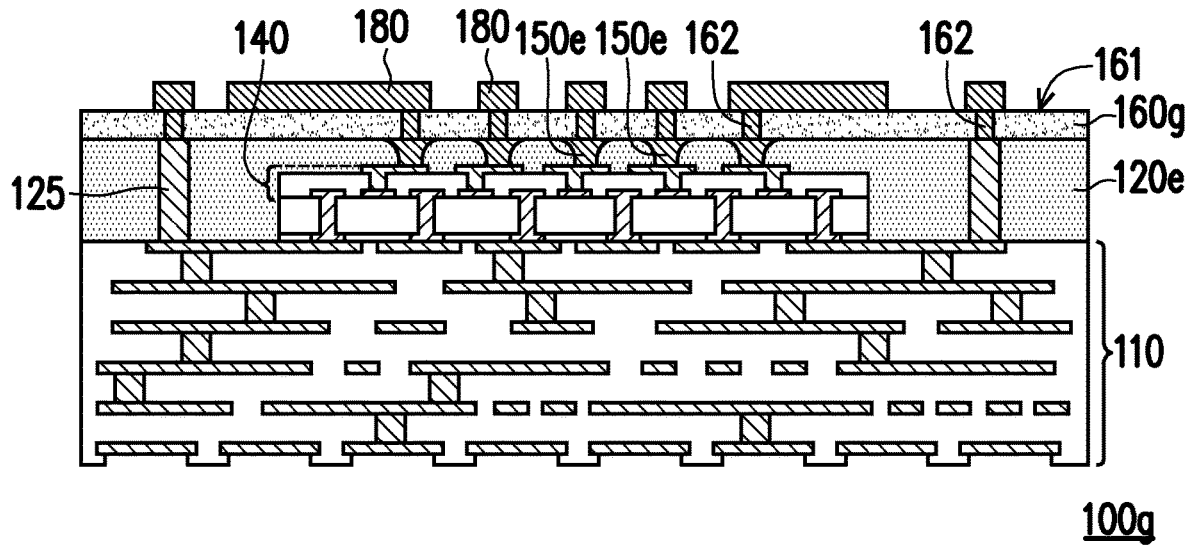

FIG. 9G is a cross-sectional view of a package substrate according to an embodiment of the present disclosure. Referring to FIG. 9G and FIG. 9E at the same time, a package substrate 100g of the present embodiment is similar to the package substrate 100e of FIG. 9E, and the difference between the two is that the package substrate 100g further includes a light-transmissive layer 160g covering the insulating protective layer 120e, wherein the light-transmissive layer 160g comprising a plurality of conductive micro-pillars 162 therein. Herein, a material of the light-transmissive layer 160g includes, for example, epoxy molding compound (EMC) or Ajinomoto build-up film (ABF), but the invention is not limited thereto. The conductive micro-pillars 162 are connected to the conductive micro-bumps 150e, and a width of the conductive micro-pillar 162 is less than or equal to a width of the conductive micro-bump 150e. In addition, the package substrate 100g further includes a plurality of conductive micro-bumps 180 respectively disposed on the conductive micro-pillars 162 for repositioning, wherein the conductive micro-bumps 180 are extended along an upper surface 161 of the light-transmissive layer 160g. As aforementioned in the embodiment of FIG. 9E, since the first upper end 151 of the conductive micro-bump 150e exposed from the insulating protective layer 120e may be deformed due to the Planarization process, for example Chemical Mechanical Planarization (CMP) process, the follow-up processing cannot proceed by considering the deformed conductive micro-bump 150e as an alignment mark. Therefore, at least one of the conductive micro-bumps 180 may be extended toward a position close to a center of the conductive micro-bump 150e which is under the corresponding conductive micro-bump 180. Herein, at least part of the conductive micro-bumps 180 can be used as alignment marks for follow-up process.

Figure 9H:
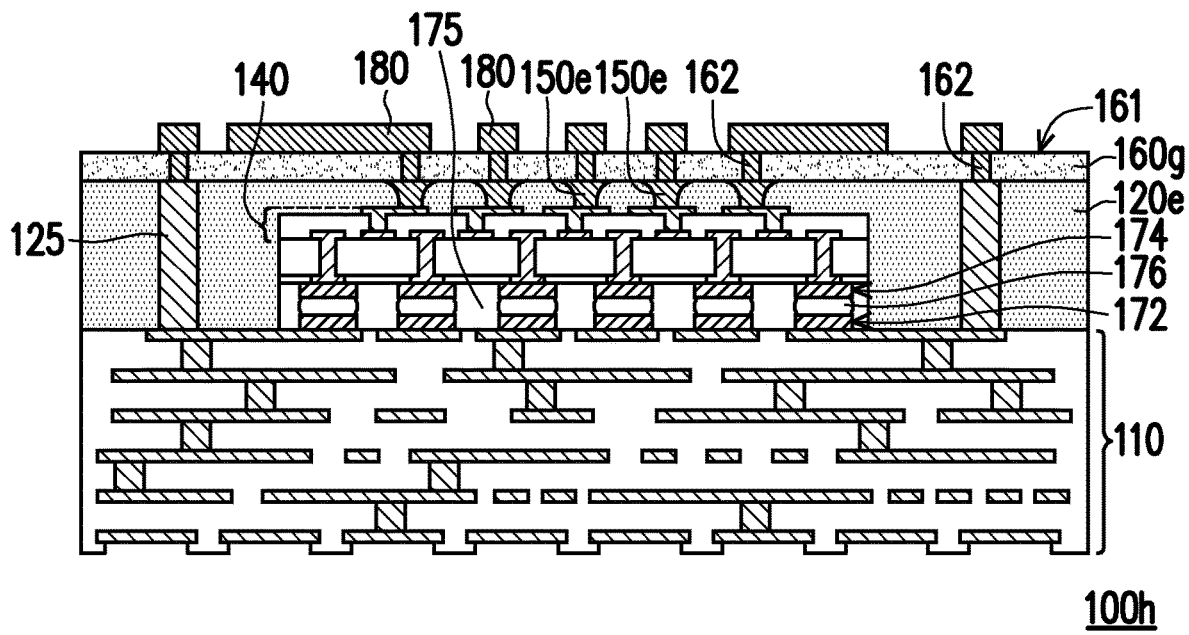

FIG. 9H is a cross-sectional view of a package substrate according to an embodiment of the present disclosure. Referring to FIG. 9H and FIG. 9G at the same time, a package substrate 100h of the present embodiment is similar to the package substrate 100g of FIG. 9G, and the package substrate 100h further includes a first metal layer 172 disposed between the first conductive pads 112 of the substrate 110 and the second conductive pads 134 of the interposer 130. Furthermore, the package substrate 100h further includes a second metal layer 174, wherein the first metal layer 172 is disposed on the first conductive pads 112 of the substrate 110, and the second metal layer 174 is disposed on the second conductive pads 134 of the interposer 130. The first metal layer 172 and the second metal layer 174 are eutectic joined by the solder 176. In other words, the interposer 130 and the substrate 110 are bonded together through eutectic bonding. In addition, the package substrate 100h further includes a filling layer 175 disposed between the substrate 110 and the interposer 130 to encapsulate the firs metal layer 172, the second metal layer 174 and the solder 176.

Figure 9I:
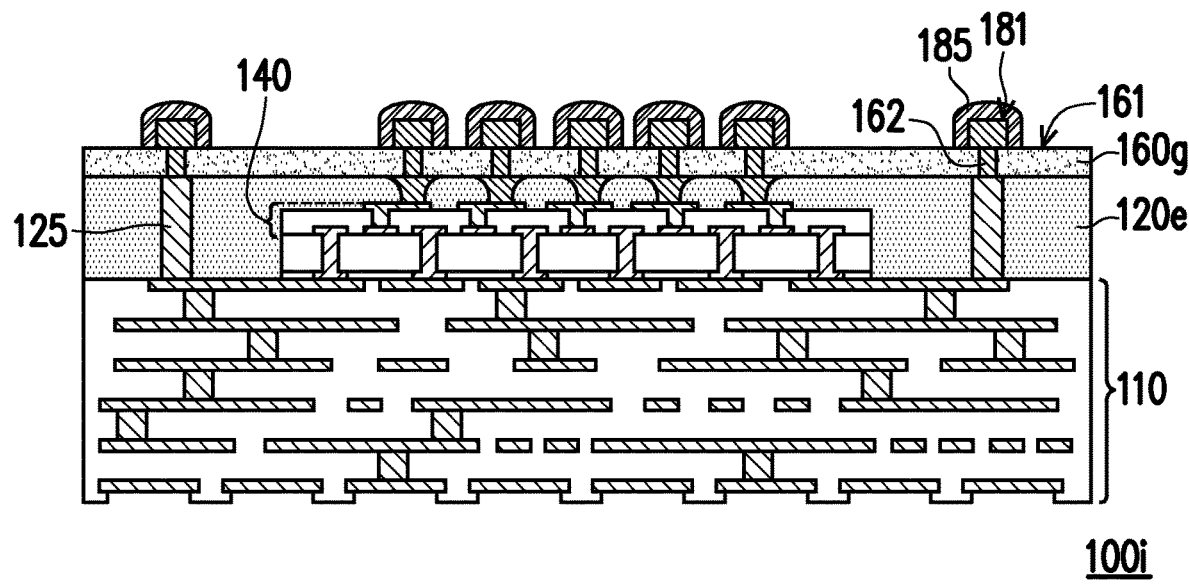

FIG. 9I is a cross-sectional view of a package substrate according to an embodiment of the present disclosure. Referring to FIG. 9I and FIG. 9G at the same time, a package substrate 100i of the present embodiment is similar to the package substrate 100g of FIG. 9G, and the upper end 181 of the conductive micro-bump 180 is capped with a cap layer 185. The cap layer 185 includes, for example, an organic solderability preservative cap layer or a metal cap layer. A material of the metal cap layer includes for example, copper, nickel-palladium-gold, nickel, tin, tin-lead, gold, silver, palladium, indium, nickel-gold, the like, or a combination thereof. Herein, the cap layer 185 is a surface protection layer to protect the conductive micro-bump 180 from being attacked and oxidized by moisture.

Figure 9J:
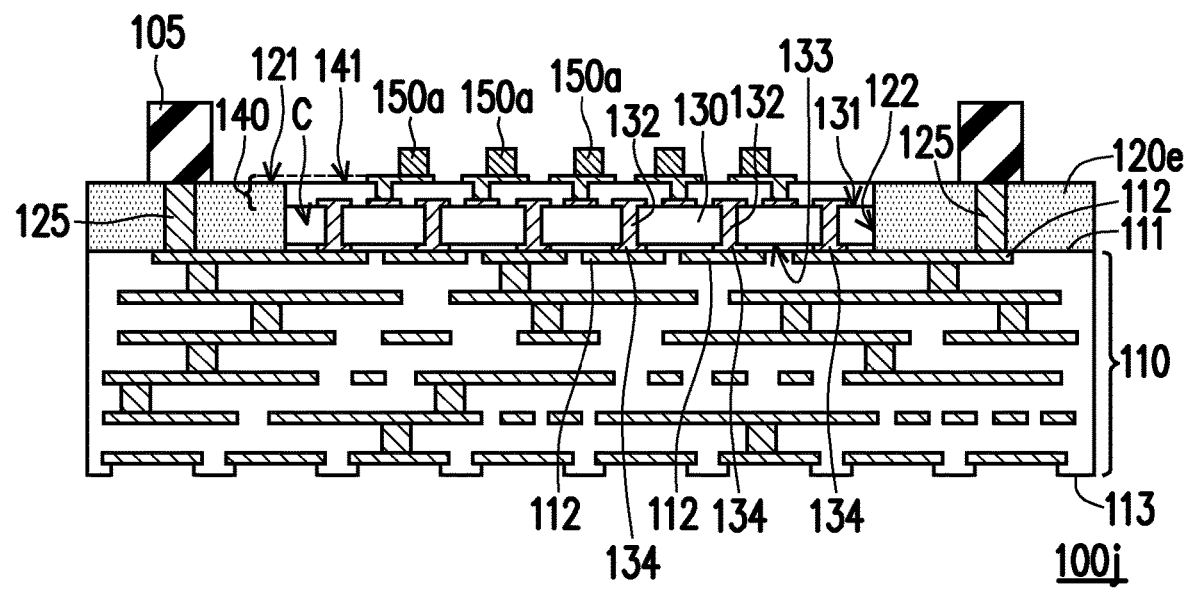

FIG. 9J is a cross-sectional view of a package substrate according to an embodiment of the present disclosure. Referring to FIG. 9J and FIG. 9A at the same time, a package substrate 100J of the present embodiment is similar to the package substrate 100a of FIG. 9A, and the package substrate 100j further includes at least a passive component 105 electrically connected to the first conductive pads 112 of the substrate 110.

For a method for fabricating the package substrate of the present embodiment, referring to FIG. 9C, the substrate 110 having the first surface 111 and the second surface 113 opposing the first surface 111 is provided, wherein the substrate 110 includes the first conductive pads 112 embedded in the first surface 111. Then, the interposer 130 having the top surface 131 and the bottom surface 133 opposing to the top surface 131 is provided on the first surface 111 of the substrate 110, wherein the interposer 130 may include the conductive vias 132 and the second conductive pads 134 located on the bottom surface 133, and the second conductive pads 134 of the interposer 130 can be connected with the first conductive pads 112 of the substrate 110, so that the interposer 130 is electrically connected to the substrate 110. The wiring redistribution layer 140 can be formed on the top surface 131 of the interposer 130 before or after the interposer 130 is provided on the first surface 111 of the substrate 110.

In the embodiment, referring to FIG. 9C, the insulating protective layer 120*a* is then provided to encapsulate the wiring redistribution layer 140 and the interposer 130. In other embodiments, referring to FIGS. 8A to 8F', the insulating protective layer 120*a* may be provided on the first surface 111 of the substrate 110 and then the interposer 130 can be embedded into a recess (such as the cavity 330 shown in FIG. 8C) defined by an opening of the insulating protective layer and the first surface of the substrate.

Referring to FIG. 9C again, the upper surface 121 of the insulating protective layer 120*a* and the upper surface 141 of the wiring redistribution layer 140 are planarized by chemical mechanical planarization (CMP) process, therefore, the upper surface 141 of the wiring redistribution layer 140 and the upper surface 121 of the insulating protective layer 120*a* can be coplanar.

In other embodiment, referring to FIG. 9G, the insulating protective layer 120*e* may be further provided to covers the upper surface 141 of the wiring redistribution layer 140. Still referring to the embodiment shown in FIG. 9G, the first upper end 151 of the conductive micro-bump 150*e* may be deformed after planarization by applying chemical mechanical planarization (CMP) process to the upper surface 121 of the insulating protective layer 120*e*.

Optionally, referring to FIG. 9C and FIG. 9G again, the conductive column 125 in the insulating protective layer 120*a*, 120*e* is provided, wherein the upper end of the conductive column 125 is exposed from the insulating protective layer 120*a*, 120*e*, and a lower end of the conductive column 125 is electrically connected to the substrate 110. Herein, the width of the conductive column 125 is greater than the width of each of the conductive vias 132.

Still referring to the embodiment shown in FIG. 9G, the light-transmissive layer 160*g* can be formed to cover the insulating protective layer 120*e*, wherein the light-transmissive layer 160*g* may include the conductive micro-pillar 162 therein.

Figure 10A:
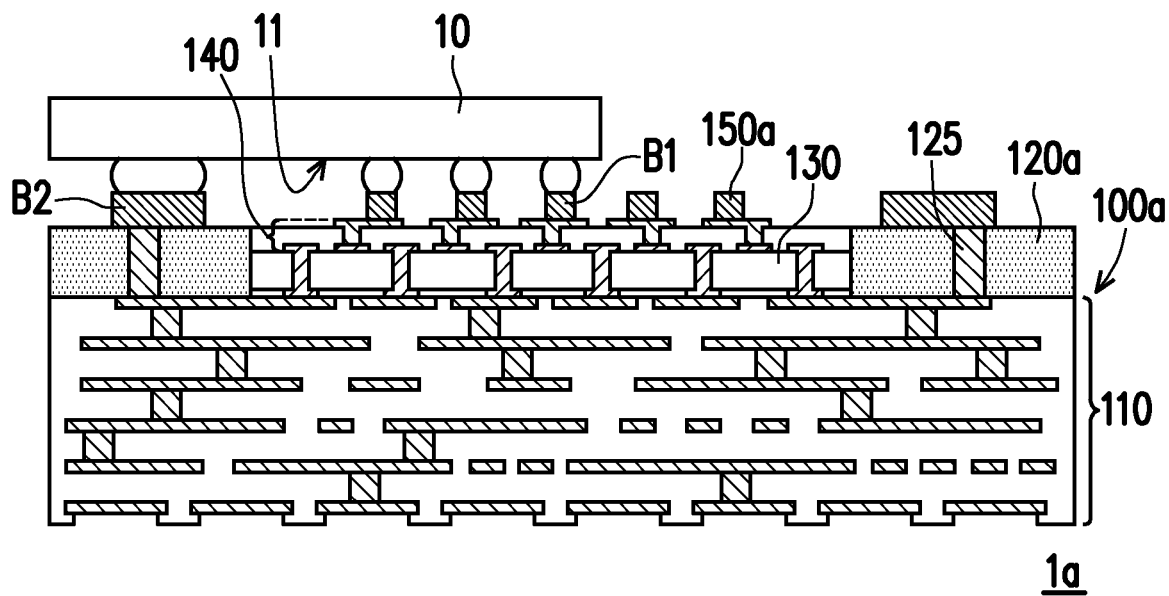
FIG. 10A to FIG. 10C are cross-sectional view of a chip package substrate according to various embodiment of the present disclosure.

FIG. 10A is a cross-sectional view of a chip package substrate according to an embodiment of the present disclosure. Referring to FIG. 9A and FIG. 10A together, a chip package structure 1*a* of the present embodiment includes a chip 10, the package structure 100*a* (same as FIG. 9A), a first conductive block B1 and a second conductive block B2. The chip 10 has an active surface 11. The package substrate 100*a* includes the interposer 130 and the insulating protective layer 120*a*. The first conductive block B1 (i.e. parts of the conductive micro-bumps 150*a*) is located between the active surface 11 of the chip 10 and the top surface 131 of the interposer 130 and electrically connected with the chip 10, wirings of the wiring redistribution layer 140 and/or at least one of the conductive vias 132 of the interposer 130. The second conductive block B2 is located between the active surface 11 of the chip 10 and the insulating protective layer 120*a* and electrically connected with the chip 10 and the conductive columns 125, wherein a width of the first conductive block B1 is smaller than a width of the second conductive block B2. In other words, an orthographic projection of the chip 10 on the package substrate 100*a* does not completely overlap an orthographic projection of the interposer 130 on the package substrate 100*a*, and the chip 10 and the interposer 130 are arranged in a misaligned configuration. In an embodiment, the second conductive block B2 can be used for transporting higher electrical power than the first conductive block B1, in other words, the second conductive block B2 can be considered as a power pad for providing working power of the chip and the second conductive block B2 can be considered as a signal pad for communicating signals between the chip 10 and other chips or devices (not shown) through the embedded interposer 130 and/or the substrate 110, but the invention is not limited thereto.

Figure 10B:
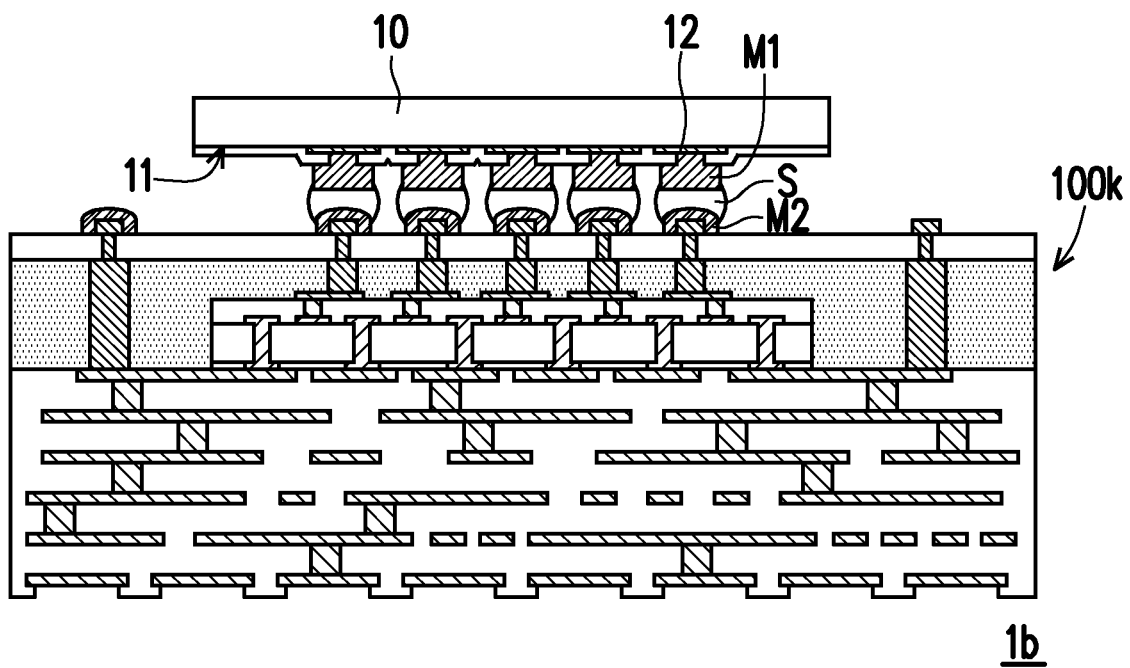

FIG. 10B is a cross-sectional view of a chip package substrate according to an embodiments of the present disclosure. Referring to FIG. 10B and FIG. 10A at the same time, the chip package substrate 1*b* of the present embodiment is similar to the chip package substrate 1*a* of FIG. 10A, and the chip 10 is electrically connected to the package substrate 100*k* by the metal M1, the alloy S and the metal M2. The orthographic projection of the chip 10 on the package substrate 100*a* completely overlaps the orthographic projection of the interposer 130 on the package substrate 100*a*, and the chip 10 and the interposer 130 are aligned.

Figure 10C:
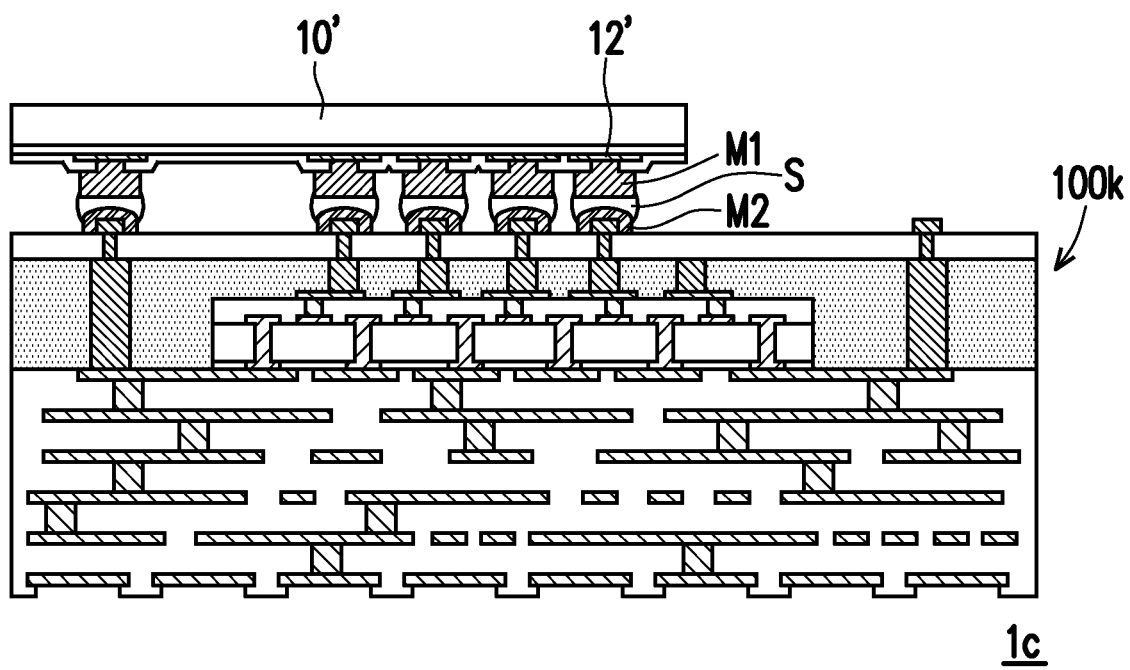

FIG. 10C is a cross-sectional view of a chip package substrate according to an embodiments of the present disclosure. Referring to FIG. 10C and FIG. 10A at the same time, the chip package substrate 1*c* of the present embodiment is similar to the chip package substrate 1*a* of FIG. 10A, and the chip 10 is electrically connected to the package substrate 100*k* by the metal M1, the alloy S and the metal M2.

Figure 11A:
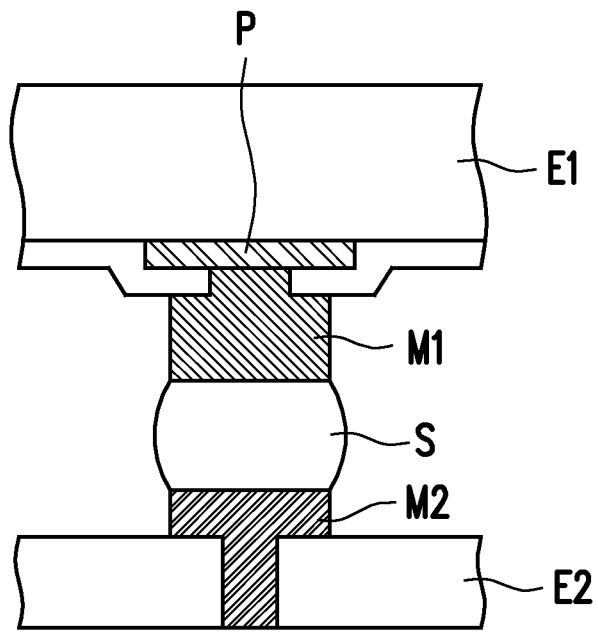
FIG. 11A to FIG. 11H are cross-sectional view of two elements bonded together according to various embodiment of the present disclosure.
Figure 11B:
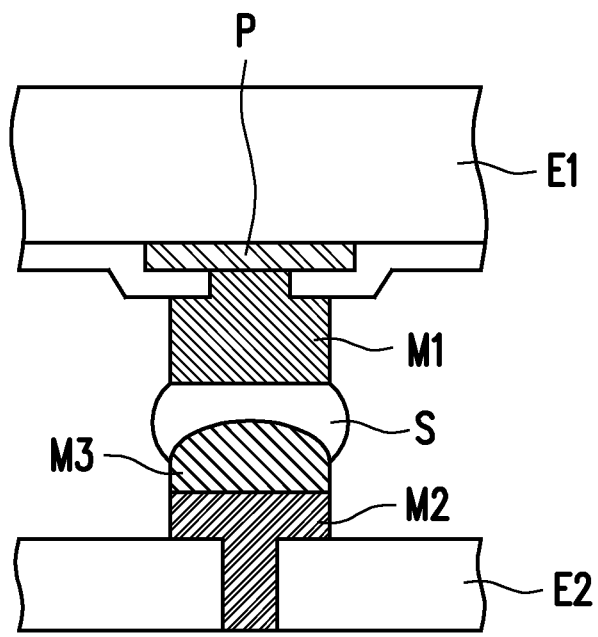
Figure 11C:
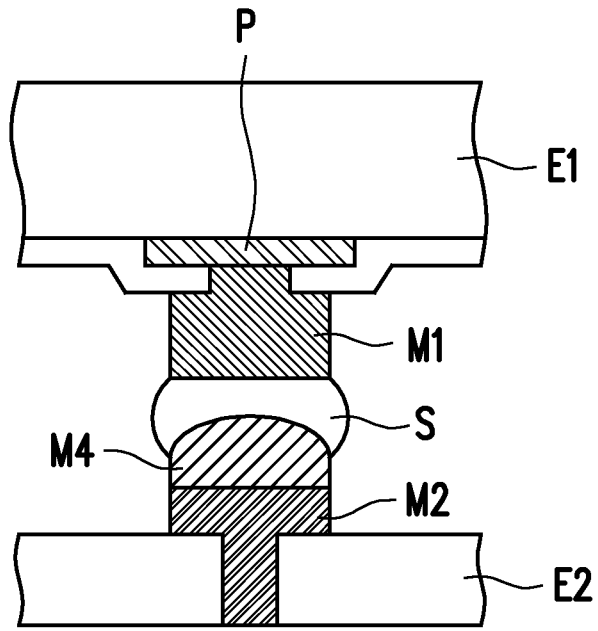
Figure 11D:
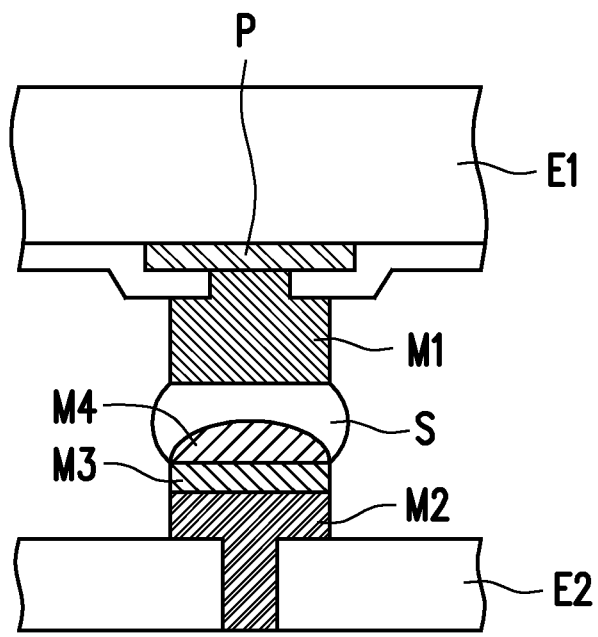

In more detail, referring to FIG. 11A, the chip 10 can be regarded as the element E1, and the package substrate 100*k* can be regarded as the element E2. The element P can be regarded as a chip pad and can be omitted. The metal M1 is formed on the element E1, and the metal M2 is formed on the element E2, wherein the metal M1 and the metal M2 are eutectic joined by alloy S. Herein, the metal M1 and the metal M2 are copper respectively, and the alloy S is Sn—Ag alloy. In other embodiment, referring to FIG. 11B, there is a metal M3 between the alloy S and the metal M2, wherein the metal M3 can be a nickel. In other embodiment, referring to FIG. 11C, there is a metal M4 between the alloy S and the metal M2, wherein the metal M4 can be a palladium. In other embodiment, referring to FIG. 11D and FIG. 11B at the same time, the difference between the two is that there is a metal M4 is between the alloy S and the metal M3, wherein the metal M4 can be a palladium.

Figure 11E:
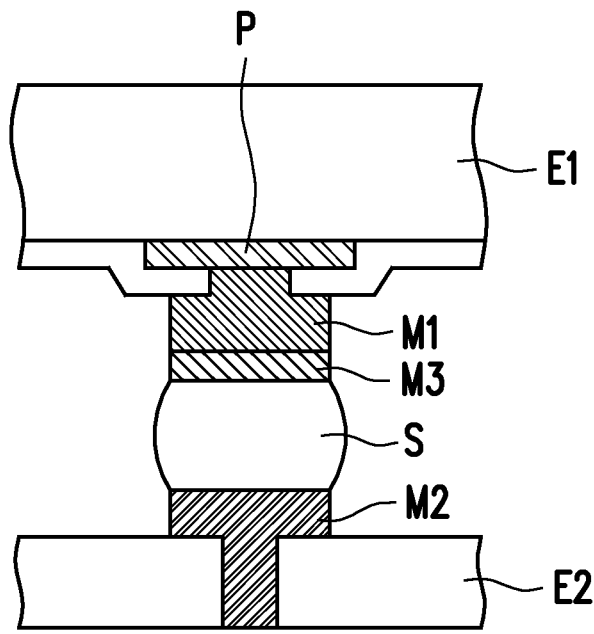
Figure 11F:
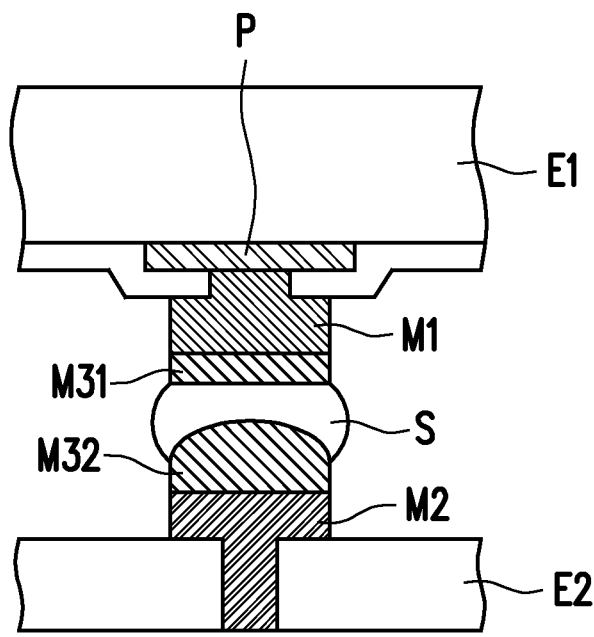
Figure 11G:
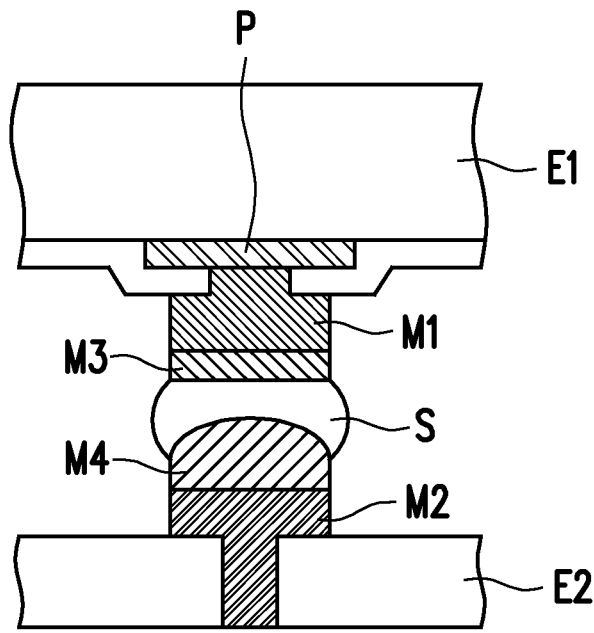
Figure 11H:
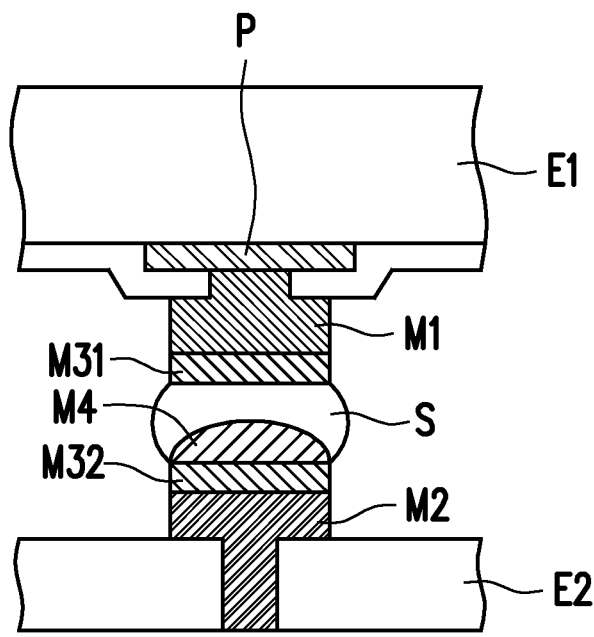

In other embodiment, referring to FIG. 11E, there is a metal M3 between the alloy S and the metal M1, wherein the metal M3 can be a nickel. In other embodiment, referring to FIG. 11F and FIG. 11E at the same time, the difference between the two is that there is a metal M31 between the alloy S and the metal Ml, and there is a metal M32 between the alloy S and the metal M2, wherein the metal M31 and the metal M2 can be nickel, respectively. In other embodiment, referring to FIG. 11G and FIG. 11E at the same time, the difference between the two is that there is a metal M4 is between the alloy S and the metal M2, wherein the metal M4 can be a palladium. In other embodiment, referring to FIG. 11H and FIG. 11F at the same time, the difference between the two is that there is a metal M4 is between the alloy S and the metal M32, wherein the metal M4 can be a palladium.

It is worth mentioning that in other embodiment, the interposer 130 can be regarded as the element E1, and the substrate 110 can be regarded as the element E2. The metal M3 and the metal M4 can be nickel-palladium-gold, nickel, tin, tin-lead, gold, silver, palladium, indium, nickel-gold, the like, or a combination thereof, but the invention is not limited thereto.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A package substrate, comprising:
a substrate having a first surface and a second surface opposing to the first surface, the substrate comprising a plurality of first conductive pads embedded in the first surface;
an insulating protective layer disposed on the first surface of the substrate, and the insulating protective layer having an opening for exposing a portion of the plurality of first conductive pads embedded in the first surface of the substrate; and
an interposer having a top surface and a bottom surface opposing to the top surface, and the interposer comprising a plurality of conductive vias and a plurality of second conductive pads located on the bottom surface, wherein the bottom surface faces the first surface;
wherein the interposer is located in a recess defined by the opening of the insulating protective layer and the first surface of the substrate, the insulating protective layer surrounds and directly covers side surfaces of the interposer, and each of the plurality of second conductive pads is electrically connected to corresponding first conductive pad.

2. The package substrate of claim 1, further comprising:
a wiring redistribution layer located in the recess and covering the interposer, wherein a first surface of the wiring redistribution layer and a second surface of the insulating protective layer are coplanar.

3. The package substrate of claim 2, further comprising:
a plurality of conductive micro-bumps disposed on the wiring redistribution layer or in the insulating protective layer.

4. The package substrate of claim 3, further comprising:
an organic dielectric layer covering the wiring redistribution layer and the insulating protective layer.

5. The package substrate of claim 2, further comprising:
a plurality of conductive micro-pillars disposed on the wiring redistribution layer or in the insulating protective layer.

6. The package substrate of claim 5, further comprising:
an organic dielectric layer covering the wiring redistribution layer and the insulating protective layer.

7. The package substrate of claim 6, further comprising:
a plurality of conductive micro-bumps disposed in the organic dielectric layer and connected to the plurality of conductive micro-pillars, respectively.

8. The package substrate of claim 1, further comprising:
a plurality of conductive columns disposed in the insulating protective layer, wherein the plurality of conductive columns are respectively penetrating the insulating protective layer.

9. The package substrate of claim 1, further comprising:
a metal layer formed between at least one of the first conductive pad of the substrate and at least one of the second conductive pad of the interposer.

10. The package substrate of claim 1, further comprising:
a first metal layer and a second metal layer, wherein the first metal layer is disposed on the plurality of first conductive pads of the substrate, and the second metal layer is disposed on the plurality of second conductive pads of the interposer.

11. The package substrate of claim 1, further comprising:
a filling layer disposed between the substrate and the interposer.

12. The package substrate of claim 1, further comprising:
at least a passive component electrically connected to the substrate.

13. The package substrate of claim 1, wherein the interposer is an active interposer.

14. The package substrate of claim 1, further comprising:
a wiring redistribution layer located in the recess and covering the interposer;
a first conductive micro-bump disposed in the wiring redistribution layer; and
a conductive column disposed on the first surface of the substrate;
wherein the insulating protective layer covers the first surface of the substrate, the wiring redistribution layer, the interposer and the conductive column;
wherein a first upper end of the first conductive micro-bump and a second upper end of the conductive column are exposed from the insulating protective layer.

15. The package substrate of claim 14, wherein the first upper end of the first conductive micro-bump is capped with a cap layer.

16. The package substrate of claim 15, wherein the cap layer comprises an organic solderability preservative cap layer or a metal cap layer.

17. The package substrate of claim 16, wherein a material of the metal cap layer comprises copper, nickel-palladium-gold, nickel, tin, tin-lead, gold, silver, palladium, indium, nickel-gold, the like, or a combination thereof.

18. The package substrate of claim 14, wherein the first upper end of the first conductive micro-bump is wider than a first lower end of the first conductive micro-bump.

19. The package substrate of claim 14, further comprising:
a light-transmissive layer covering the insulating protective layer, wherein the light-transmissive layer comprising a conductive micro-pillar therein;
wherein the conductive micro-pillar is connected to the first conductive micro-bump and a width of the conductive micro-pillar is less than or equal to a width of the first conductive micro-bump.

20. The package substrate of claim 19, further comprising:
a second conductive micro-bump disposed on the conductive micro-pillar,
wherein the second conductive micro-bump is extended along an upper surface of the light-transmissive layer, and the second conductive micro-bump is extended toward a center of the first conductive micro-bump.

21. A method of fabricating a package substrate, comprising:
providing a substrate having a first surface and a second surface opposing the first surface, wherein the substrate comprises a plurality of first conductive pads embedded in the first surface;
providing an interposer having a top surface and a bottom surface opposing to the top surface, wherein the interposer comprises a plurality of conductive vias and a plurality of second conductive pads located on the bottom surface;
forming a wiring redistribution layer on the top surface of the interposer;
providing an insulating protective layer to encapsulate the wiring redistribution layer and the interposer; and connecting the plurality of second conductive pads of the interposer with the plurality of first conductive pads of the substrate, wherein the bottom surface faces the first surface.

22. The method of fabricating the package substrate of claim 21, further comprising:
planarizing an upper surface of the insulating protective layer and an upper surface of the wiring redistribution layer.

23. The method of fabricating the package substrate of claim 21, further comprising:
planarizing an upper surface of the insulating protective layer, wherein the insulating protective layer covers a upper surface of the wiring redistribution layer.

24. The method of fabricating the package substrate of claim 21, further comprising:
providing a conductive column in the insulating protective layer, wherein an upper end of the conductive column is exposed from the insulating protective layer, and a lower end of the conductive column is electrically connected to the substrate.

25. The method of fabricating the package substrate of claim 24, wherein a width of the conductive column is greater than a width of each of the plurality of conductive vias.

26. The method of fabricating the package substrate of claim 21, further comprising:
forming a light-transmissive layer covering the insulating protective layer, wherein the light-transmissive layer comprises a conductive micro-pillar therein.

27. A chip package structure, comprising:
a chip having an active surface;
a package substrate comprising:
an interposer having a top surface, a bottom surface opposing to the top surface and side surfaces, and the interposer comprising a plurality of conductive vias and a plurality of conductive pads located on the bottom surface; and
an insulating protective layer encapsulating the side surfaces of the interposer;
a first conductive block located between the active surface of the chip and the top surface of the interposer and electrically connected with the chip and at least one of the plurality of conductive vias of the interposer; and
a second conductive block located between the active surface of the chip and the insulating protective layer, wherein a width of the first conductive block is smaller than a width of the second conductive block.

* * * * *

UNITED STATES PATENT AND TRADEMARK OFFICE
CERTIFICATE OF CORRECTION

| | | |
|---|---|---|
| PATENT NO. | : 11,854,961 B2 | Page 1 of 1 |
| APPLICATION NO. | : 17/095744 | |
| DATED | : December 26, 2023 | |
| INVENTOR(S) | : Yu-Hua Chen et al. | |

It is certified that error appears in the above-identified patent and that said Letters Patent is hereby corrected as shown below:

On the Title Page

Item (30) Foreign Application Priority Data Should read: Sept. 26, 2012 (TW) ......101135246

Signed and Sealed this
Seventeenth Day of September, 2024

Katherine Kelly Vidal
*Director of the United States Patent and Trademark Office*